(12) United States Patent
Yamashita et al.

(10) Patent No.: US 10,964,603 B2
(45) Date of Patent: Mar. 30, 2021

(54) HYBRID GATE STACK INTEGRATION FOR STACKED VERTICAL TRANSPORT FIELD-EFFECT TRANSISTORS

(71) Applicant: International Business Machines Corporation, Armonk, NY (US)

(72) Inventors: Tenko Yamashita, Schenectady, NY (US); Takashi Ando, Tuckahoe, NY (US); Oleg Gluschenkov, Tannersville, NY (US); Chen Zhang, Guilderland, NY (US); Koji Watanabe, Rensselaer, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/384,545

(22) Filed: Apr. 15, 2019

(65) Prior Publication Data
US 2020/0328127 A1 Oct. 15, 2020

(51) Int. Cl.
*H01L 21/8238* (2006.01)
*H01L 21/324* (2006.01)
(Continued)

(52) U.S. Cl.
CPC .... *H01L 21/823885* (2013.01); *H01L 21/265* (2013.01); *H01L 21/308* (2013.01);
(Continued)

(58) Field of Classification Search
CPC ..... H01L 21/823885; H01L 21/823431; H01L 21/823487; H01L 27/0886; H01L 27/0924;
(Continued)

(56) References Cited

U.S. PATENT DOCUMENTS 6,770,534 B2 8/2004 Cho et al.
7,683,428 B2 3/2010 Chidambarrao et al.
(Continued)

FOREIGN PATENT DOCUMENTS

| CN | 107799593 A | 3/2018 |
|---|---|---|
| WO | 2018182615 A1 | 4/2018 |
| WO | PCT/IB2020/052795 | 7/2020 |

*Primary Examiner* — Hsien Ming Lee

(74) *Attorney, Agent, or Firm* — Douglas Pearson; Ryan, Mason & Lewis, LLP

(57) ABSTRACT

A method of forming a semiconductor structure includes forming one or more vertical fins each including a first semiconductor layer providing a vertical transport channel for a lower vertical transport field-effect transistor (VTFET) of a stacked VTFET structure, an isolation layer over the first semiconductor layer, and a second semiconductor layer over the isolation layer providing a vertical transport channel for an upper VTFET of the stacked VTFET structure. The method also includes forming a first gate stack including a first gate dielectric layer and a first gate conductor layer surrounding a portion of the first semiconductor layer of the vertical fins. The method further includes forming a second gate stack including a second gate dielectric layer and a second gate conductor layer surrounding a portion of the second semiconductor layer of the vertical fins. The first gate conductor layer and the second gate conductor layer are the same material.

22 Claims, 23 Drawing Sheets

(51) Int. Cl.
*H01L 29/49* (2006.01)
*H01L 21/762* (2006.01)
*H01L 21/265* (2006.01)
*H01L 27/092* (2006.01)
*H01L 29/786* (2006.01)
*H01L 21/308* (2006.01)

(52) U.S. Cl.
CPC ...... *H01L 21/324* (2013.01); *H01L 21/76224* (2013.01); *H01L 21/823814* (2013.01); *H01L 21/823842* (2013.01); *H01L 27/092* (2013.01); *H01L 29/4966* (2013.01); *H01L 29/78642* (2013.01)

(58) Field of Classification Search
CPC ......... H01L 27/10841; H01L 29/66666; H01L 29/66909; H01L 29/78642; H01L 29/7827
See application file for complete search history.

(56) References Cited

U.S. PATENT DOCUMENTS

| | | | |
|---|---|---|---|
| 9,536,793 | B1 | 1/2017 | Zhang et al. |
| 9,659,963 | B2 | 5/2017 | Cheng et al. |
| 9,831,131 | B1 | 11/2017 | Jacob |
| 9,947,789 | B1 | 4/2018 | Suvarna |
| 9,954,529 | B2 | 4/2018 | Anderson et al. |
| 10,297,513 | B1* | 5/2019 | Yamashita ........ H01L 21/28088 |
| 2006/0261406 | A1 | 11/2006 | Chen |
| 2011/0012085 | A1* | 1/2011 | Deligianni .......... H01L 29/0676 257/9 |
| 2012/0104484 | A1 | 5/2012 | Lee et al. |
| 2015/0048458 | A1* | 2/2015 | Zhu ...................... H01L 21/265 257/369 |
| 2016/0043074 | A1 | 2/2016 | Hurley et al. |
| 2017/0025412 | A1 | 1/2017 | Jun et al. |
| 2017/0317210 | A1 | 11/2017 | Anderson et al. |
| 2018/0277442 | A1 | 9/2018 | Leobandung |

* cited by examiner

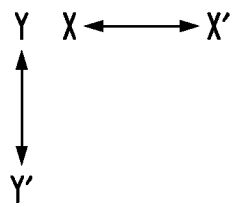
FIG. 1
100
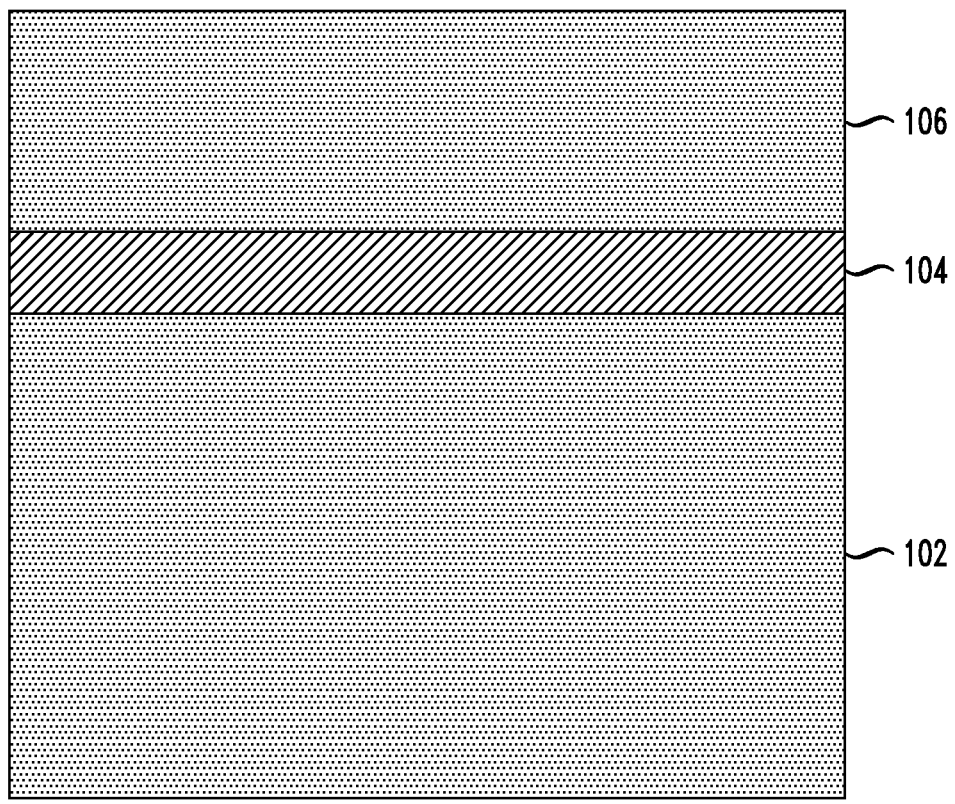

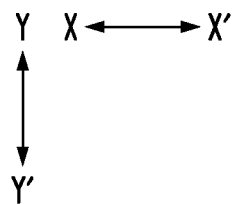
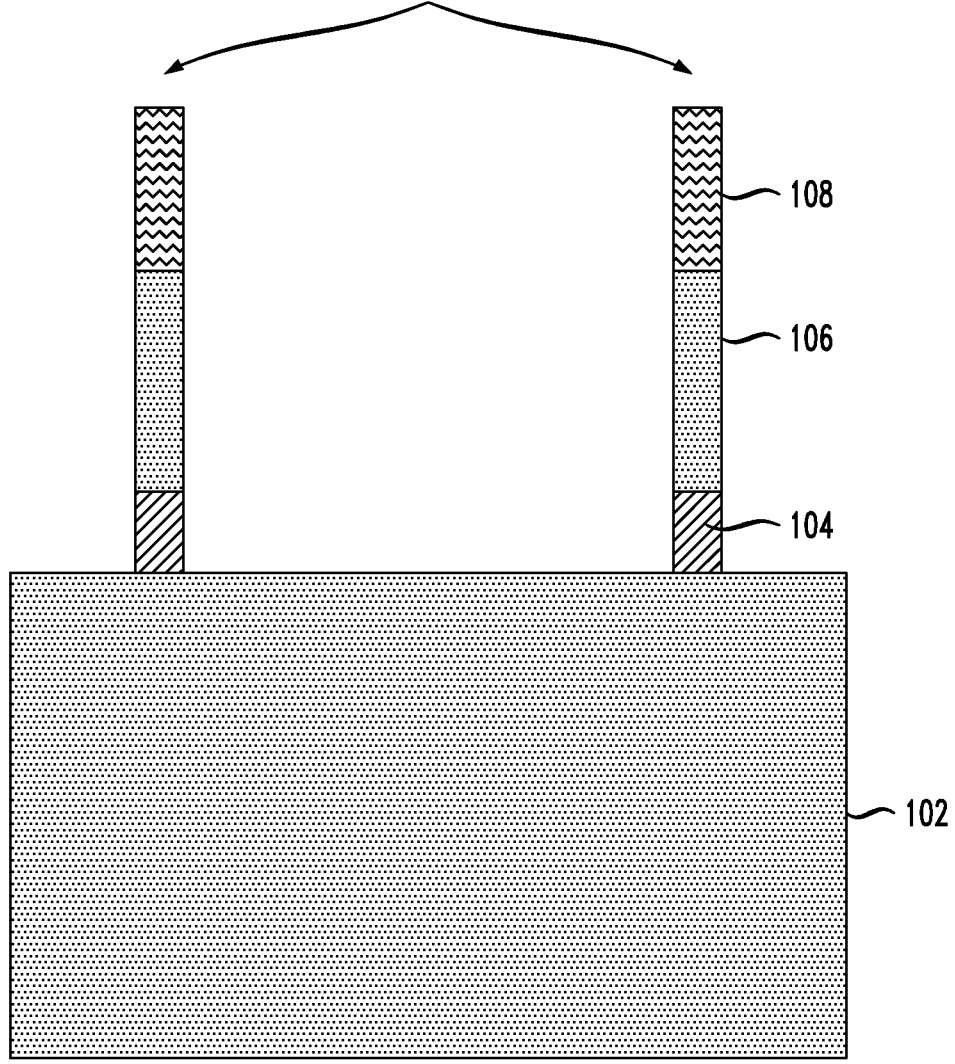
FIG. 2

1200

1400

1500

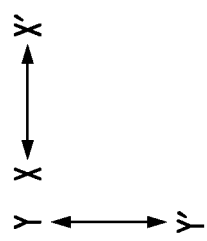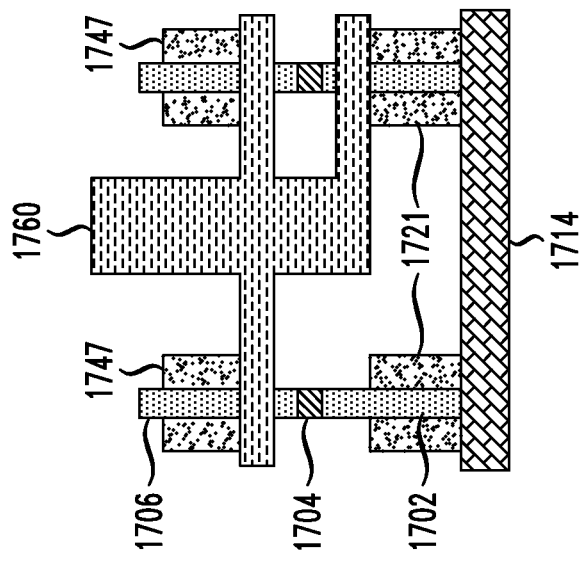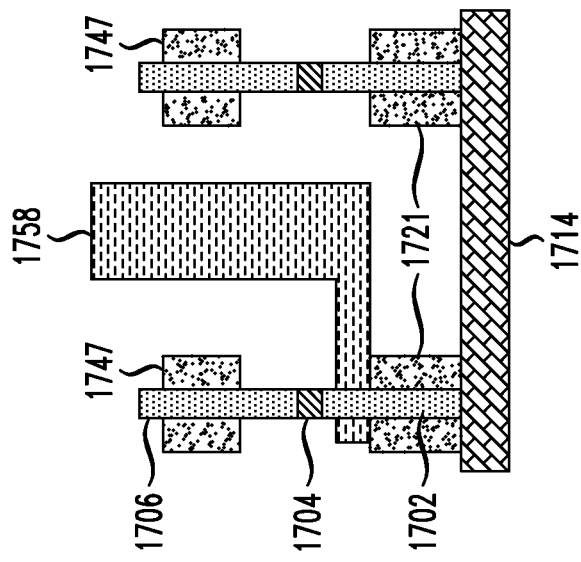

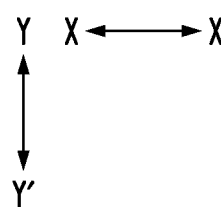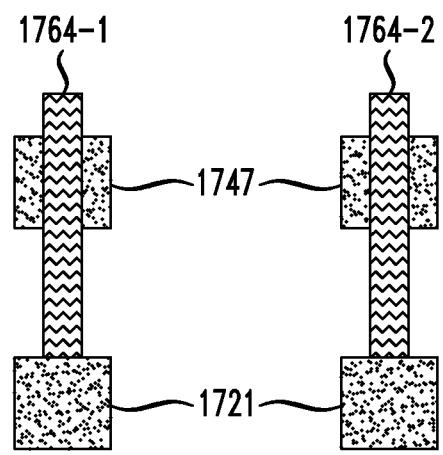
FIG. 17E
1795

1900

2100

HYBRID GATE STACK INTEGRATION FOR STACKED VERTICAL TRANSPORT FIELD-EFFECT TRANSISTORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for hybrid gate stack integration for stacked vertical transport field-effect transistor structures.

In one embodiment, a method of forming a semiconductor structure comprises forming one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure. The method also comprises forming a first gate stack comprising a first gate dielectric layer and a first gate conductor layer surrounding a portion of the first semiconductor layer of each of the one or more vertical fins. The method further comprises forming a second gate stack comprising a second gate dielectric layer and a second gate conductor layer surrounding a portion of the second semiconductor layer of each of the one or more vertical fins. The first gate conductor layer and the second gate conductor layer comprise a same material.

In another embodiment, a semiconductor structure comprises one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure. The semiconductor structure also comprises a first gate stack comprising a first gate dielectric layer and a first gate conductor layer surrounding a portion of the first semiconductor layer of each of the one or more vertical fins. The semiconductor structure further comprises a second gate stack comprising a second gate dielectric layer and a second gate conductor layer surrounding a portion of the second semiconductor layer of each of the one or more vertical fins. The first gate conductor layer and the second gate conductor layer comprise a same material.

In another embodiment, an integrated circuit comprises a stacked vertical transport field-effect transistor structure. The stacked vertical transport field-effect transistor structure comprises one or more vertical fins each comprising a first semiconductor layer providing a vertical transport channel for a lower vertical transport field-effect transistor of the stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure. The stacked vertical transport field-effect transistor structure also comprises a first gate stack comprising a first gate dielectric layer and a first gate conductor layer surrounding a portion of the first semiconductor layer of each of the one or more vertical fins. The stacked vertical transport field-effect transistor structure further comprises a second gate stack comprising a second gate dielectric layer and a second gate conductor layer surrounding a portion of the second semiconductor layer of each of the one or more vertical fins. The first gate conductor layer and the second gate conductor layer comprise a same material.

BRIEF DESCRIPTION OF THE DRAWINGS

FIG. 1 depicts a cross-sectional view of a semiconductor on insulator on semiconductor substrate, according to an embodiment of the invention.

FIG. 2 depicts a cross-sectional view of the FIG. 1 structure following formation of top vertical fins, according to an embodiment of the invention.

FIG. 17C depicts a third cross-sectional view of contacts for a NAND logic gate, according to an embodiment of the invention.

FIG. 17D depicts a fourth cross-sectional view of contacts for a NAND logic gate, according to an embodiment of the invention.

FIG. 17E depicts a fifth cross-sectional view of contacts for a NAND logic gate, according to an embodiment of the invention.

DETAILED DESCRIPTION

Figure 3:
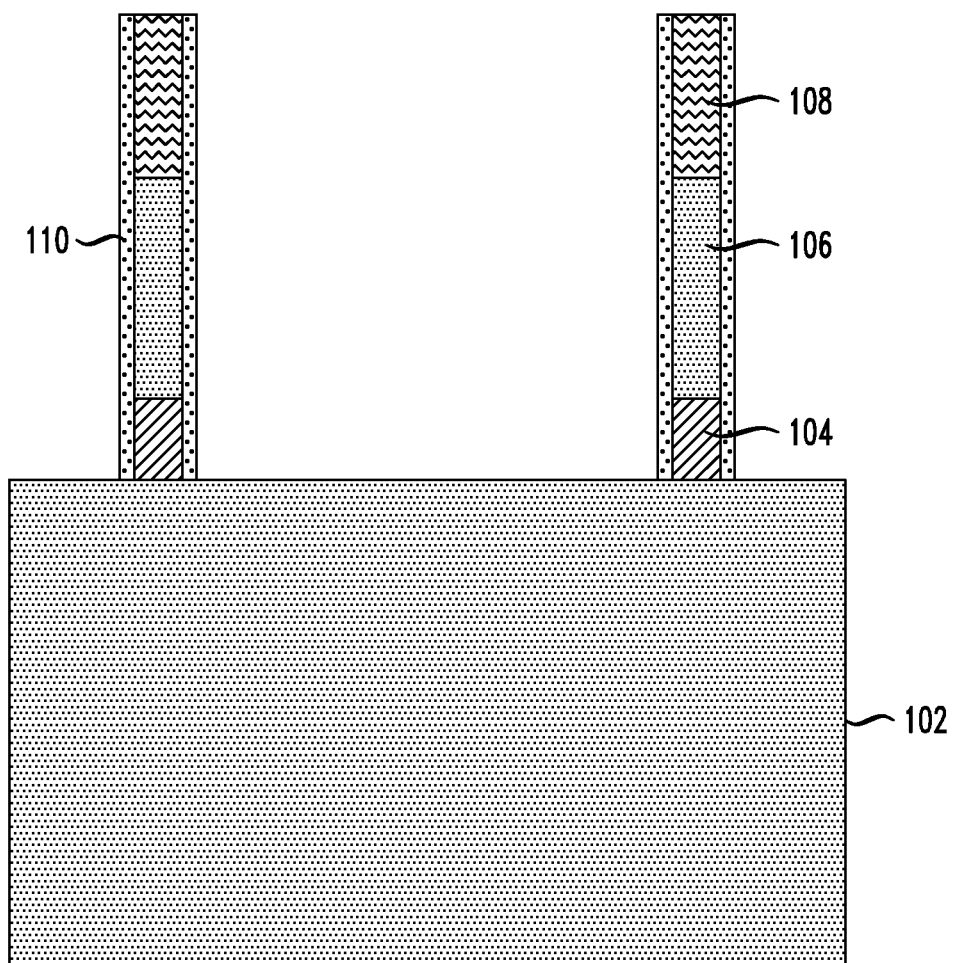
FIG. 3 depicts a cross-sectional view of the FIG. 2 structure following formation of a liner on sidewalls of the top vertical fins, according to an embodiment of the invention.

Illustrative embodiments of the invention may be described herein in the context of illustrative methods for hybrid gate stack integration in stacked vertical transport field-effect transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Stacking FETs in a vertical direction gives an additional dimension for CMOS area scaling. It is difficult, however, to stack planar FETs. Vertical transport FETs (VTFETs) are being pursued as viable CMOS architectures for scaling to 7 nanometers (nm) and beyond. VTFETs provide the opportunity for further device scaling compared with other device architectures. VTFETs have various potential advantages over other conventional structures such as fin field-effect transistors (FinFETs). Such advantages may include improvements in density, performance, power consumption, and integration. VTFETs may further provide advantages in stacking FETs.

Illustrative embodiments provide techniques for hybrid gate stack integration in stacked VTFETs, which enables the use of a same gate conductor material (e.g., a same work function metal (WFM) such as titanium nitride (TiN)) used for both the upper and lower VTFETs in the stacked VTFET structure. The gate conductor material, or WFM material, plays an important role in directed stacked VTFET integration. Illustrative embodiments enable the use of the same gate conductor material (e.g., a WFM such as TiN) for upper and lower VTFETs in a stacked VTFET structure by using a rapid thermal anneal (RTA) for the lower VTFETs (e.g., which provide nFET devices in some embodiments) and using a laser-only anneal for the upper VTFETs (e.g., which provide pFET devices in some embodiments). The gate stack for the lower VTFETs (e.g., the bottom nFET gate stack) is formed using a gate-first process, while the gate stack for the upper VTFETs (e.g., the top pFET gate stack) is formed using a gate-last process.

Embodiments provide techniques for forming stacked VTFET structures, where the lower VTFETs or bottom-tier nFET devices use a gate-first processing flow and the upper VTFETs or top-tier pFET devices use a gate-last processing flow. The gate-first flow uses an annealed gate conductor material (e.g., an annealed WFM such as annealed TiN) in the gate stack for the bottom-tier nFET devices, and the gate-last flow uses the same gate conductor material un-annealed (e.g., an un-annealed WFM such as un-annealed TiN). Gate dielectric deposition and reliability anneal processes happen twice, once for the bottom-tier nFET devices and once for the top-tier pFET devices.

Illustrative processes for hybrid gate stack integration in stacked VTFET structures that enable use of a same gate conductor material for both the upper and lower VTFETs of the stacked VTFET structures will now be described with respect to FIGS. 1-21.

FIG. 1 shows a cross-sectional view 100 of a bulk substrate 102, an insulator layer 104 formed over the bulk substrate 102, and a semiconductor layer 106 formed over the insulator layer 104. The semiconductor layer 106 and insulator 104 may form a thin buried oxide (BOX) silicon-on-insulator (SOI).

The bulk substrate 102 and semiconductor layer 106 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The bulk substrate 102 and semiconductor layer 106 may have the same or different crystalline orientations, depending on the types of VTFET devices that are to be formed from the FIG. 1 structure. In some embodiments, for example, the bulk substrate 102 and semiconductor layer 106 have different crystalline orientations for formation of nFET and pFET devices. For example, a first crystalline orientation (110) may be used for formation of nFET devices and a second crystalline orientation (100) may be used for formation of pFET devices.

For clarity of illustration, FIGS. 1-21 are shown and described with respect to forming a stacked VTFET structure with just two VTFETs vertically stacked (e.g., in direction Y-Y'). In other embodiments, however, a stacked VTFET structure may include three or more VTFETs vertically stacked. Further, while FIGS. 1-21 are described with respect to stacking a VTFET of one type on top of a VTFET of another type (e.g., where the upper VTFET is a pFET device and the lower VTFET is an nFET device), embodiments are not so limited. For example, the upper and lower VTFETs may both be nFET devices or pFET devices. Further, the stacked VTFETs may include any number of nFET devices formed over any number of pFET devices as desired for a particular application.

The horizontal thickness or width (in direction X-X') of the FIG. 1 structure may vary, such as based on the number of fins that are to be formed therefrom as described in further detail below. The vertical thickness or height (in direction Y-Y') of the bulk substrate 102 may be in the range of 200 micrometers (µm) to 300 µm, and the vertical thickness or height (in direction Y-Y') of the semiconductor layer 106 may be in the range of 30 nm to 60 nm.

The insulator layer 104 may be formed of silicon dioxide ($SiO_2$) or any other suitable dielectric material that provides for N-P isolation. The insulator layer 104 may have a height or vertical thickness (in direction Y-Y') in the range of 10 nm to 30 nm.

FIG. 2 shows a cross-sectional view 200 of the FIG. 1 structure following formation of a top portion of two vertical fins 201 for "top" transistors in stacked VTFET structures formed from the semiconductor layer 106 and insulator layer 104. The top portion of the vertical fins 201 may be formed using sidewall image transfer (SIT) or other suitable techniques such as lithography and etching including reactive-ion etching (RIE), etc. As shown, a hard mask layer (HM) 108 is patterned over the top surface of the semiconductor layer 106. Each of the vertical fins 201 may have a width or horizontal thickness (in direction X-X') in the range of 6 nm to 10 nm.

The HM 108 may be formed of a nitride such as SiN, although other suitable materials may be used. The HM 108, in some embodiments, may be formed as a multi-layer, such as a multi-layer of two layers including a nitride and oxide (e.g., SiN and silicon dioxide ($SiO_2$)), a multi-layer of three layers including one or more nitride and one or more oxide layers (e.g., $SiN/SiO_2/SiN$, $SiO_2/SiN/SiO_2$), etc. The HM 108 may have a height or vertical thickness (in direction Y-Y') in the range of 10 nm to 100 nm.

Although FIG. 2 shows two vertical fins 201 formed from the FIG. 1 structure for clarity of illustration, it should be appreciated that more or fewer vertical fins may be formed from the FIG. 1 structure to form desired numbers of stacked VTFET structures.

FIG. 3 shows a cross-sectional view 300 of the FIG. 2 structure following formation of a liner 110 to protect the top vertical fins 201 during downstream processing described in further detail below. The liner 110 may be formed from a very hard material, such as a high-k dielectric material such as hafnium oxide ($HfO_2$), high-k/SiN multilayers, etc. The liner 110 may be formed via atomic layer deposition (ALD). The liner 110 may have a thickness (in direction X-X') in the range of 3 nm to 6 nm.

Figure 4:
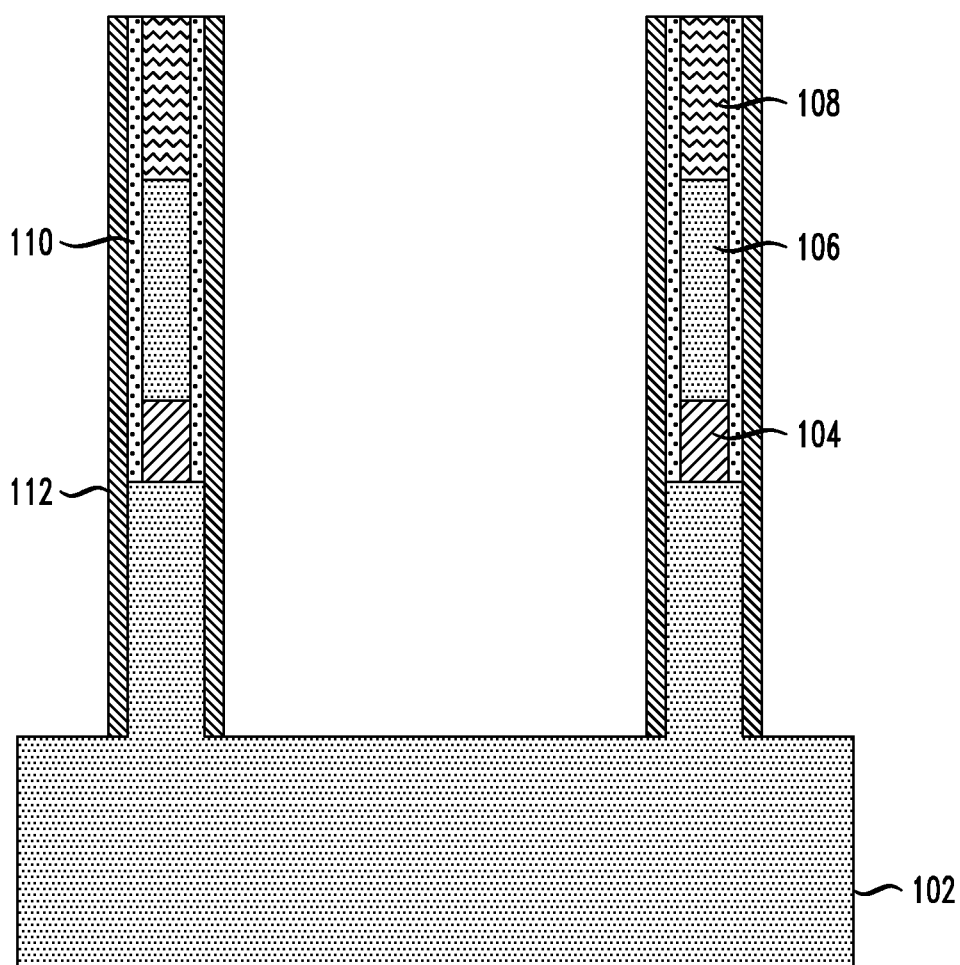
FIG. 4 depicts a cross-sectional view of the FIG. 3 structure following formation of bottom vertical fins and formation of an additional liner, according to an embodiment of the invention.

FIG. 4 shows a cross-sectional view 400 of the FIG. 3 structure following extending the vertical fins 201 into the bulk substrate 102. Thus, the vertical fins 201 have "top" portions or top fins formed from the semiconductor layer 106 and "bottom" portions or bottom fins formed from the bulk substrate 102. The vertical fins 201 may be extended into the bulk substrate 102 through additional etching (e.g., RIE). The bottom portions of the vertical fins 201 may have a height or vertical thickness (in direction Y-Y') in the range of 5 nm to 8 nm. In some embodiments, the bottom fin critical dimension (e.g., the width in direction X-X') may be trimmed at this point or at the point of gate processing as described in further detail below.

FIG. 4 also shows an additional liner 112 that is formed on sidewalls of the vertical fins 201 after the vertical fins 201 are extended into the bulk substrate 102. The liner 112 is a protective liner, which may be formed of silicon boron carbide nitride (SiBCN). The liner 112 may be formed using selective ALD. The liner 112 may have a thickness (in direction X-X') in the range of 2 nm to 4 nm.

In the description below, it is assumed that the top portions of the vertical fins 201 are used to form pFET devices and that the bottom portions of the vertical fins 201 are used to form nFET devices. It should be appreciated, however, that in other embodiments this may be reversed. Also, it is possible for both the bottom and top portions of one or more of the vertical fins 201 to be used for forming a same type of device (e.g., both nFETs, both pFETs). Various other combinations are possible.

Figure 5:
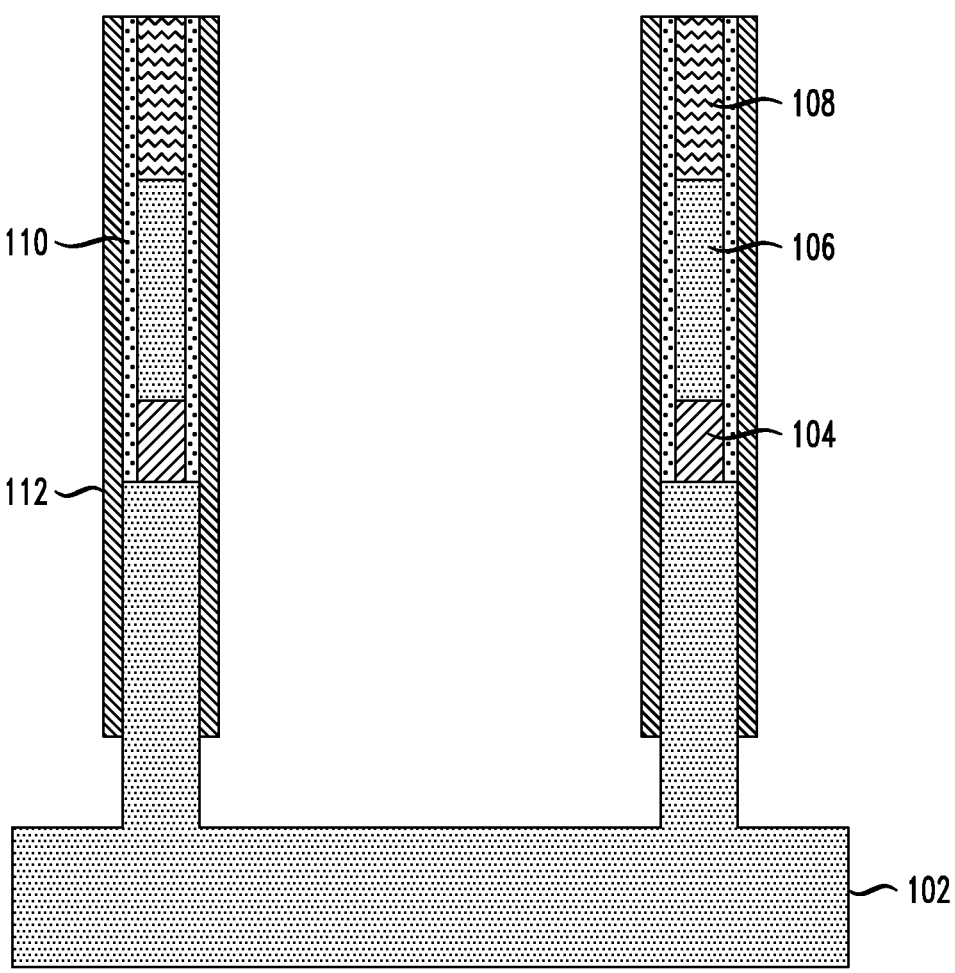
FIG. 5 depicts a cross-sectional view of the FIG. 4 structure following recess and trimming of portions of the substrate, according to an embodiment of the invention.

FIG. 5 shows a cross-sectional view 500 of the FIG. 4 structure following additional recess of the bulk substrate 102 and following trimming of the recessed portion of the bulk substrate 102. The bulk substrate 102 may be recessed below a bottom of the liner 112 to a depth in the range of 10 nm to 20 nm. The bulk substrate 102 may be recessed using various etching processes, including RIE. The additional recess of the bulk substrate 102 provides room for growth of a bottom epitaxial layer for a bottom source/drain region for the bottom VTFETs formed from the bottom portions of the vertical fins 201. Though the additional recess presents some risk as the vertical fins 201 are made even taller, there are benefits such as moving the bottom junction closer to the gate of the bottom VTFETs and in not requiring high temperature processes to push in dopants for the bottom junction.

After the additional recess of the bulk substrate 102, the recessed portion of the bulk substrate 102 may be trimmed (in direction X-X') as illustrated. The depth of the trim (in direction X-X') may be such that the recessed portion of the bulk substrate 102 has a same width or horizontal thickness (in direction X-X') as the bottom portion of the vertical fins 201. The recessed portion of the bulk substrate 102 may be trimmed using selective RIE.

Figure 6:
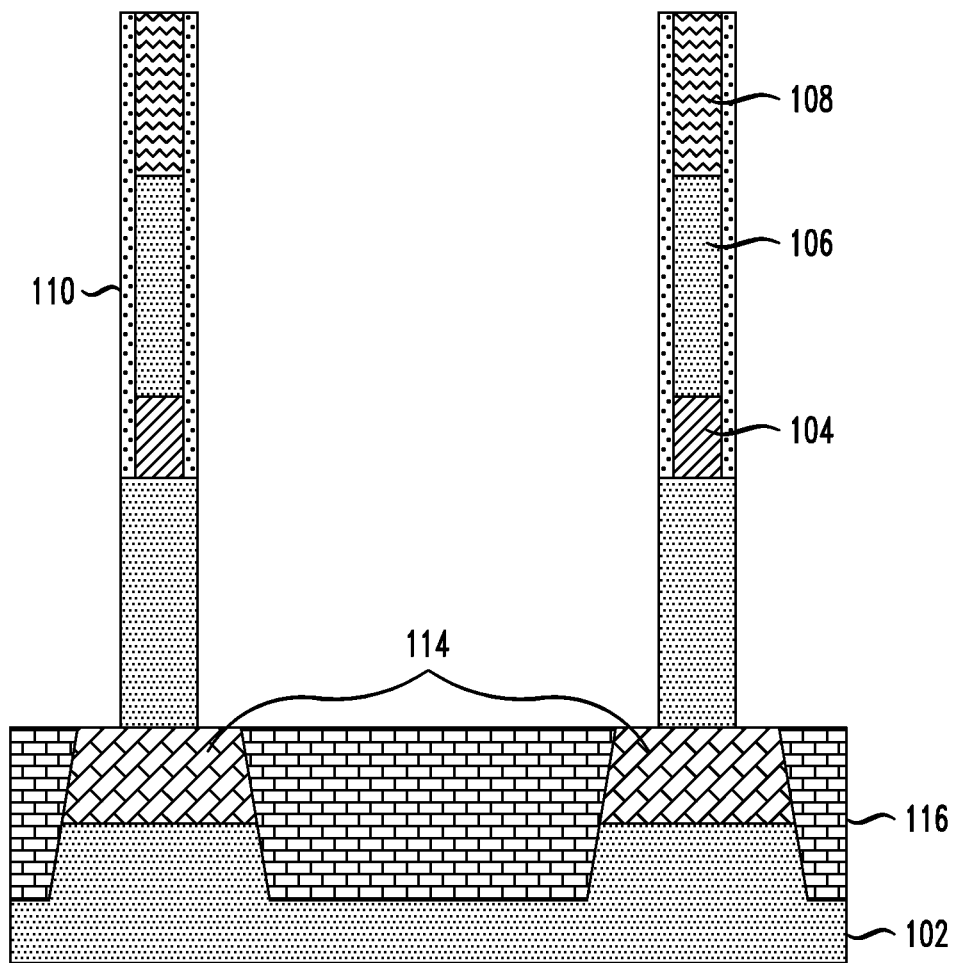
FIG. 6 depicts a cross-sectional view of the FIG. 5 structure following formation of bottom source/drain regions for the lower vertical transport field-effect transistors and following formation of shallow trench isolation regions surrounding the bottom source/drain regions, according to an embodiment of the invention.

FIG. 6 shows a cross-sectional view 600 of the FIG. 5 structure following formation of bottom source/drain regions 114 for the bottom or lower VTFETs in the stacked VTFET structure provided by each of the vertical fins 201, patterning of the bottom source/drain regions 114 (e.g., using lithography and etching, which removes the liner 112), and formation of shallow trench isolation (STI) regions 116 surrounding the bottom source/drain regions 114.

The bottom source/drain regions 114 may have a height or vertical thickness (in direction Y-Y') in the range of 15 to 30 nm. The bottom source/drain regions 114 may have a width or horizontal thickness (in direction X-X') in the range of 40 to 60 nm.

The bottom source/drain regions 114 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain region 110 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

The bottom/source drain regions 114 are surrounded by STI regions or layer 116. The STI layer 116 may have a height or vertical thickness (in direction Y-Y') in the range of 50 to 400 nm. The STI layer 116 may be formed from any suitable isolating material.

Figure 7:
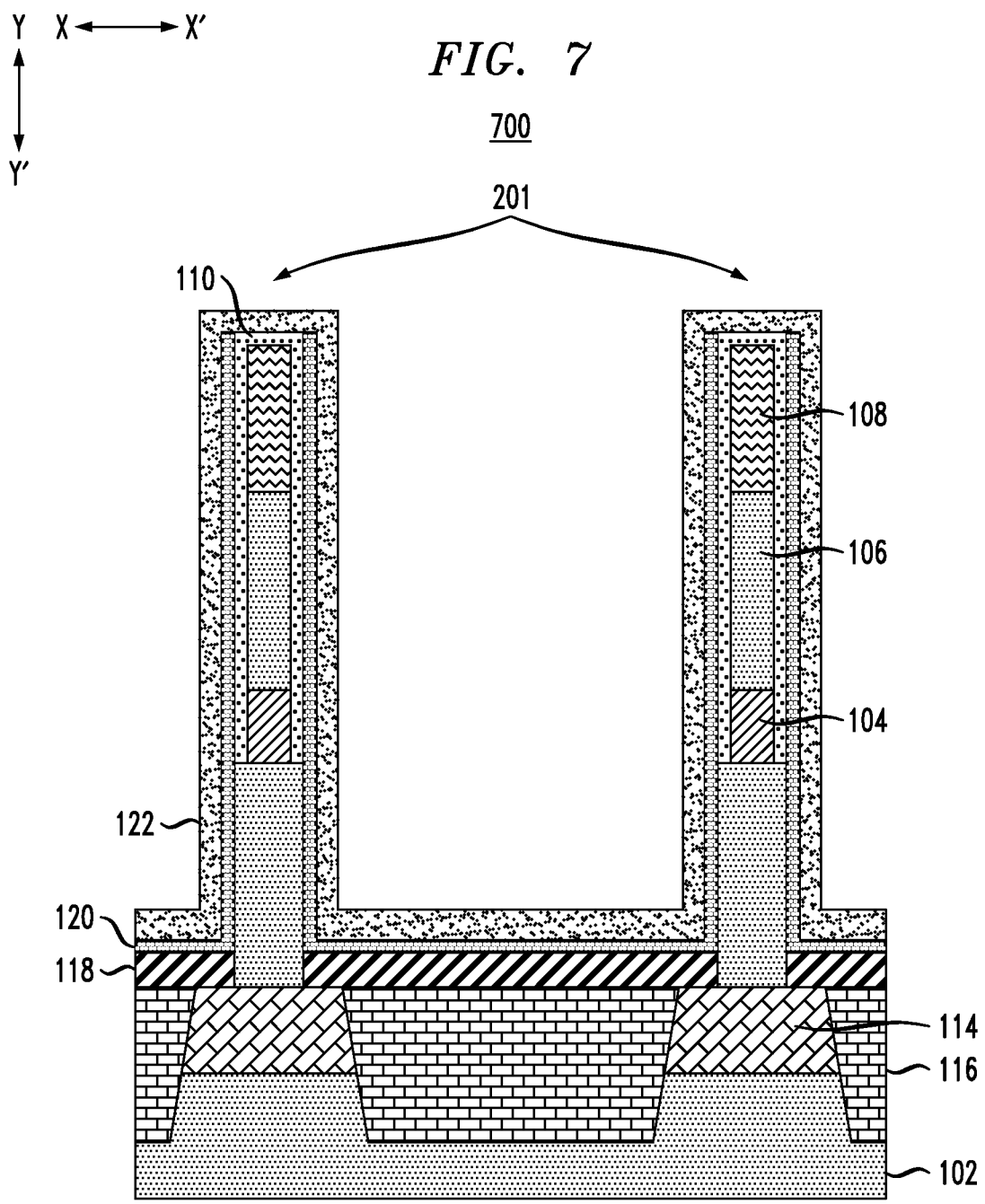
FIG. 7 depicts a cross-sectional view of the FIG. 6 structure following formation of a bottom spacer and deposition of gate stack material, according to an embodiment of the invention.

FIG. 7 shows a cross-sectional view 700 of the FIG. 6 structure following formation of a bottom spacer 118 for the lower VTFETs and following deposition of gate stack materials including a gate dielectric layer 120 and a gate conductor layer 122 in a gate-first processing scheme.

The bottom spacer 118 for the lower VTFETs is formed surrounding part of the bottom portion of the vertical fins 201 above the bottom source/drain regions 114 and STI layer 116. The bottom spacer 118 may be formed using various processing, such as non-conformal deposition and etch-back processing (e.g., physical vapor deposition (PVD), high density plasma (HDP) deposition, etc.). The bottom spacer 118 may be formed of a dielectric material such as $SiO_2$, SiN, silicon carbide oxide (SiCO), SiBCN, etc. The bottom spacer 118 may have a height or vertical thickness (in direction Y-Y') in the range of 3 to 10 nm.

After formation of the bottom spacer 118, gate stack materials including the gate dielectric layer 120 and the gate conductor layer 122 are deposited. The gate dielectric layer 120 may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer 120 may have a uniform thickness in the range of 1 nm to 3 nm.

The gate conductor layer 122 may include a metal gate or work function metal (WFM). In some embodiments, the gate conductor layer 122 is formed using ALD or another suitable process. For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor as desired. The gate conductor layer 122 may have a thickness in the range of 5 to 20 nm.

As noted above, illustrative embodiments provide techniques which enable a same gate conductor material (e.g., a same WFM such as TiN) to be used for both the lower and upper VTFETs. The gate conductor layer 122 for the lower VTFETs is annealed as described below, while the gate conductor layer 148 for the upper VTFETs (described in further detail below in connection with FIG. 19) is un-annealed (e.g., the gate conductor layer 148 is subject to a laser anneal only, not a RTA).

The FIG. 7 structure may undergo additional processing for forming the gate structure for the lower VTFETs. Such processing may include, following deposition of the gate dielectric layer 120 and the gate conductor layer 122, deposition of an amorphous silicon (a-Si) layer, a RTA reliability anneal, and removal of the a-Si layer.

Figure 8:
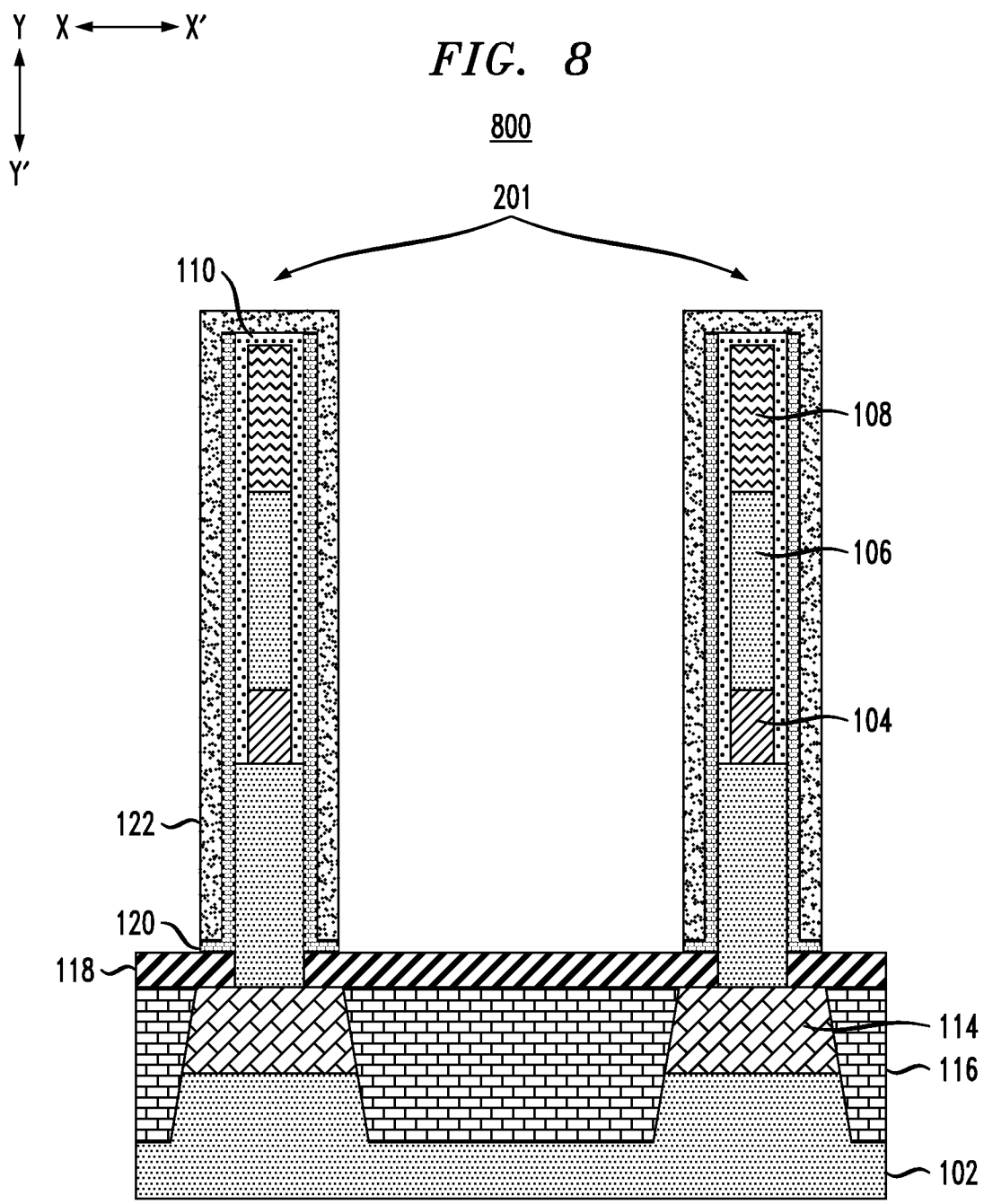
FIG. 8 depicts a cross-sectional view of the FIG. 7 structure following a gate cut, according to an embodiment of the invention.

FIG. 8 shows a cross-sectional view 800 of the FIG. 7 structure following a gate cut. The gate cut, as illustrated, etches portions of the gate dielectric layer 120 and the gate conductor layer 122. The gate cut may utilize an etching that removes the material of the gate dielectric layer 120 and the gate conductor layer 122 uniformly, such that the gate dielectric layer 120 and gate conductor layer 122 formed over the top surface of the HM 108 are removed, along with portions of the gate dielectric layer 120 and the gate conductor layer 122 that are formed between the vertical fins 201 as illustrated.

Figure 9:
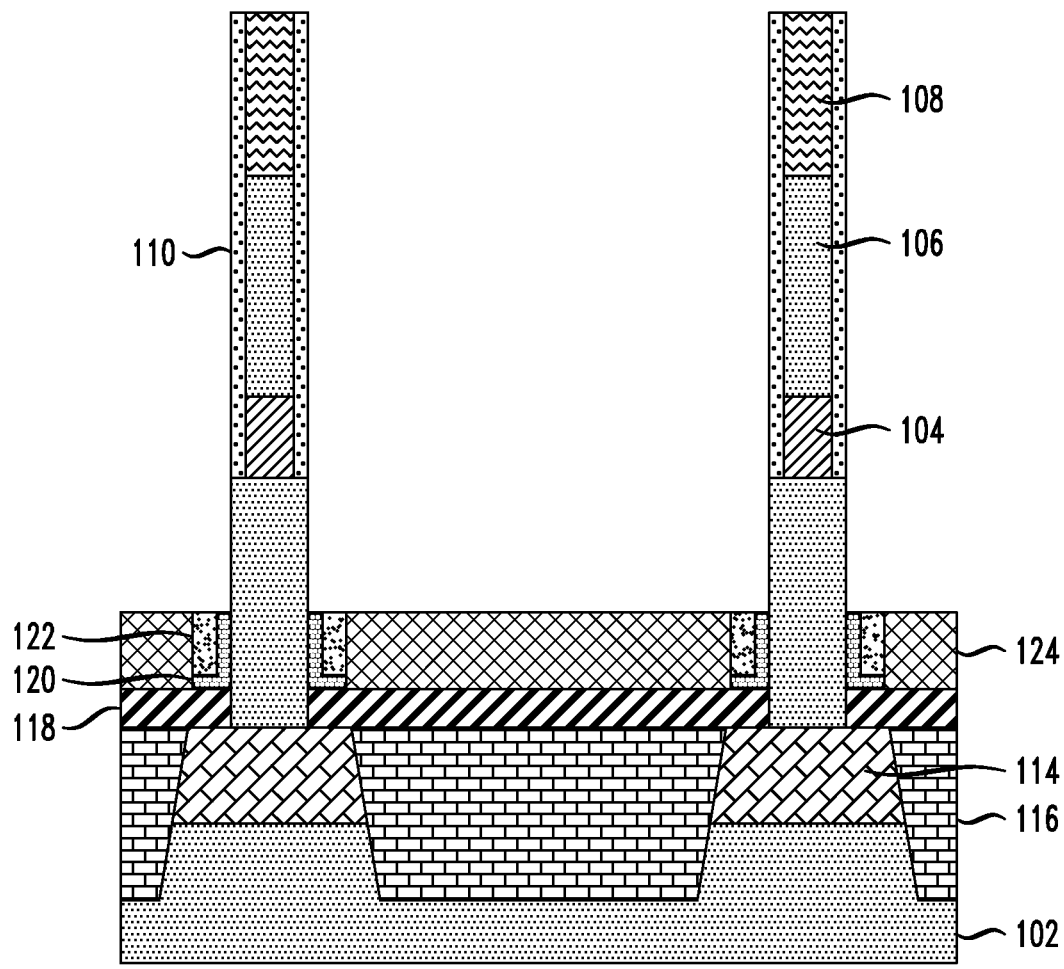
FIG. 9 depicts a cross-sectional view of the FIG. 8 structure following formation of an interlayer dielectric and recess of the gate stack, according to an embodiment of the invention.

FIG. 9 shows a cross-sectional view 900 of the FIG. 8 structure following formation of an interlayer dielectric (ILD) layer 124, and following recess of the gate stack materials. The material of the ILD layer 124 may initially be formed to fill the structure (e.g., with formation of a liner first, where the liner may be SiN), followed by chemical mechanical planarization (CMP) and etch-back. Alternatively, the material of the ILD layer 124 may be formed using HDP and etch-back processing to result in the ILD layer 124 as shown in FIG. 9. The ILD layer 124 may be formed of any suitable isolation material, including but not limited to $SiO_2$, SiOC, SiON, etc.

After formation of the ILD layer 124, the gate stack materials (e.g., gate dielectric layer 120 and gate conductor layer 122) are recessed, such that the gate stack materials have a height that matches that of the ILD layer 124. The ILD layer 124 may have a height or vertical thickness (in direction Y-Y') in the range of 10 to 30 nm. The recessed gate stack materials provide the gate for the lower VTFETs, which are assumed in this example to be nFET devices as noted above.

Figure 10:
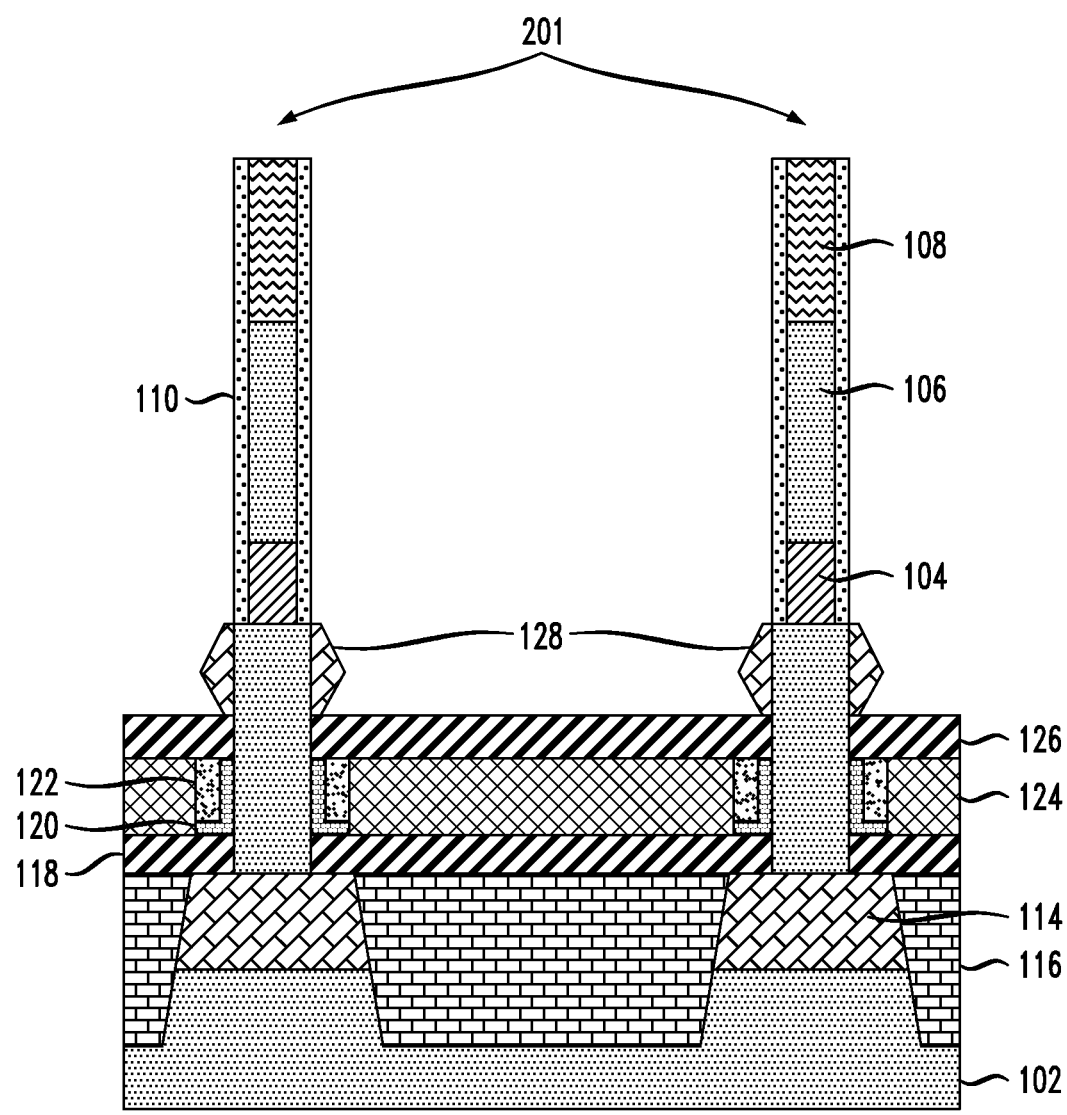
FIG. 10 depicts a cross-sectional view of the FIG. 9 structure following formation of a top spacer and top source/drain regions for the lower vertical transport field-effect transistors, according to an embodiment of the invention.

FIG. 10 shows a cross-sectional view 1000 of the FIG. 9 structure following formation of a top spacer 126 for the lower VTFETs, and following formation of top source/drain regions 128 for the lower VTFETs.

The top spacer 126 for the lower VTFETs is formed surrounding part of the bottom portion of the vertical fins 201 above the ILD layer 124. The top spacer 124 may be formed of similar materials and with similar sizing as that described above with respect to bottom spacer 118.

The top source/drain regions 128 for the lower VTFETs are formed over the top spacer 126 and surround a remaining part of the bottom portion of the vertical fins 201. The top source/drain regions 128 may be formed of similar materials and with similar processing as that described above with respect to bottom source/drain regions 114. The top source/drain regions 128 may have a height or vertical thickness (in direction Y-Y') in the range of 10 to 30 nm, and may have a width or horizontal thickness (in direction X-X') in the range of 5 to 15 nm.

Figure 11:
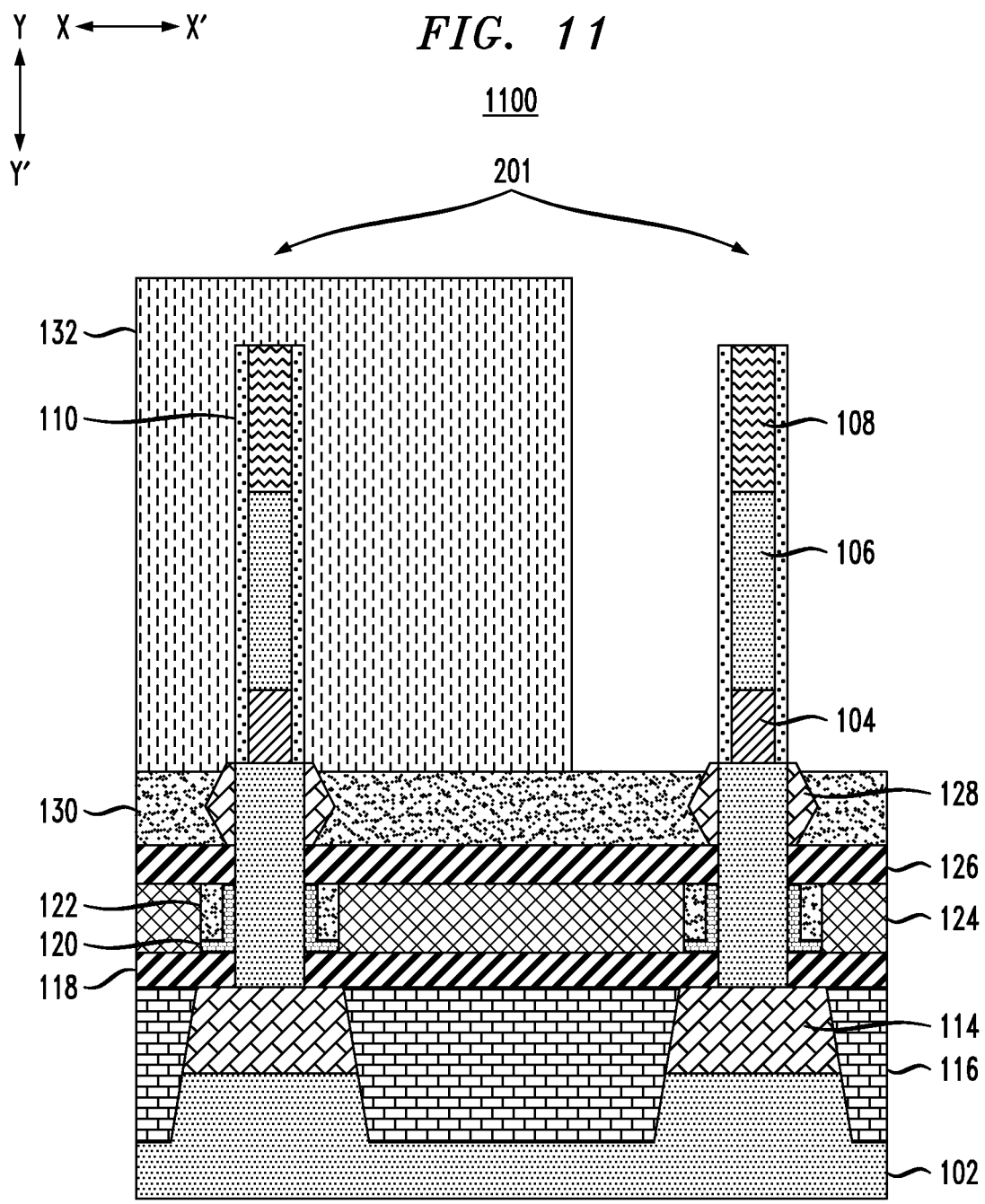
FIG. 11 depicts a cross-sectional view of the FIG. 10 structure following formation of a sacrificial oxide layer and following patterning of an organic planarization layer, according to an embodiment of the invention.

FIG. 11 shows a cross-sectional view 1100 of the FIG. 10 structure following formation of a sacrificial oxide layer 130 and following deposition and patterning of an organic planarization layer (OPL) 132 as illustrated. The sacrificial oxide layer 130 may be filled over the structure, followed by recess below a top surface of the top source/drain regions 128. The sacrificial oxide layer 130 is utilized in the formation of contacts to the top source/drain regions 128 of the lower VTFETs as will be described in further detail below. The sacrificial oxide layer 130 may be formed of any suitable oxide, such as silicon oxide ($SiO_x$).

The OPL 132 is deposited and patterned as shown, such that portions of the sacrificial oxide layer 130 may be removed to facilitate formation of contacts to desired ones of the top source/drain regions 128 during middle-of-line (MOL) contact formation. In some embodiments, the sacrificial oxide layer 130 is removed during later processing to form a contact to the "left" top source/drain region 128. This may be useful if the resulting VTFET structure provides a NAND gate, where a horizontal contact tunnel extending from the left top source/drain region 128 and connecting to a vertical via with horizontal contact tunnels to bottom source/drain regions 140 (formed during downstream processing described in further detail below) of the upper VTFETs. This shared contact to the left top source/drain region 128 for one of the lower VTFETs and the bottom source/drain regions 140 of the upper VTFETs can be used as the output node for a NAND gate. It should be appreciated, however, that this is just one example of MOL contact formation, and that in other embodiments the sacrificial oxide layer 130 may be suitably patterned (or omitted) as desired to form a particular MOL contact arrangement.

Figure 12:
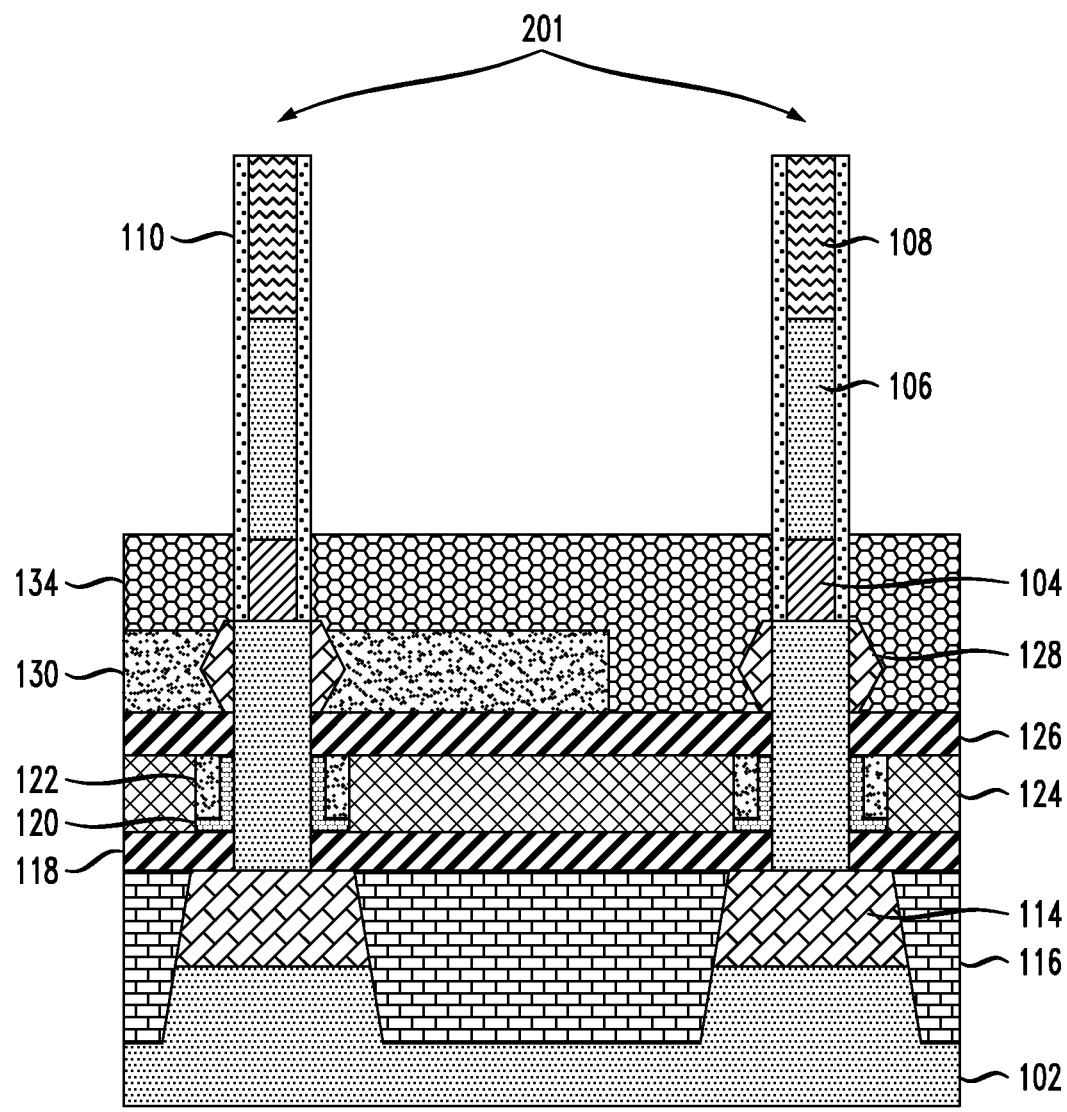
FIG. 12 depicts a cross-sectional view of the FIG. 11 structure following removal of exposed portions of the sacrificial oxide layer, removal of the organic planarization layer and formation of an isolating layer, according to an embodiment of the invention.

FIG. 12 shows a cross-sectional view 1200 of the FIG. 11 structure following removal of portions of the sacrificial oxide layer 130 exposed by the patterned OPL 132, removal of the OPL 132, and formation of isolating layer 134. The exposed portions of the sacrificial oxide layer 130 may be removed using an etching process that removes the oxide material of the sacrificial oxide layer 130 selective to the material of the HM 108 and liner 110.

The isolating layer 134, also referred to herein as an N-P isolation layer 134 or ILD layer 134, is formed to provide isolation between the upper and lower VTFETs. The ILD layer 134 may be formed of a nitride material, such as SiN, SiON, etc. The ILD layer 134 may have a height or vertical thickness (in direction Y-Y') in the range of 20 to 40 nm.

Figure 13:
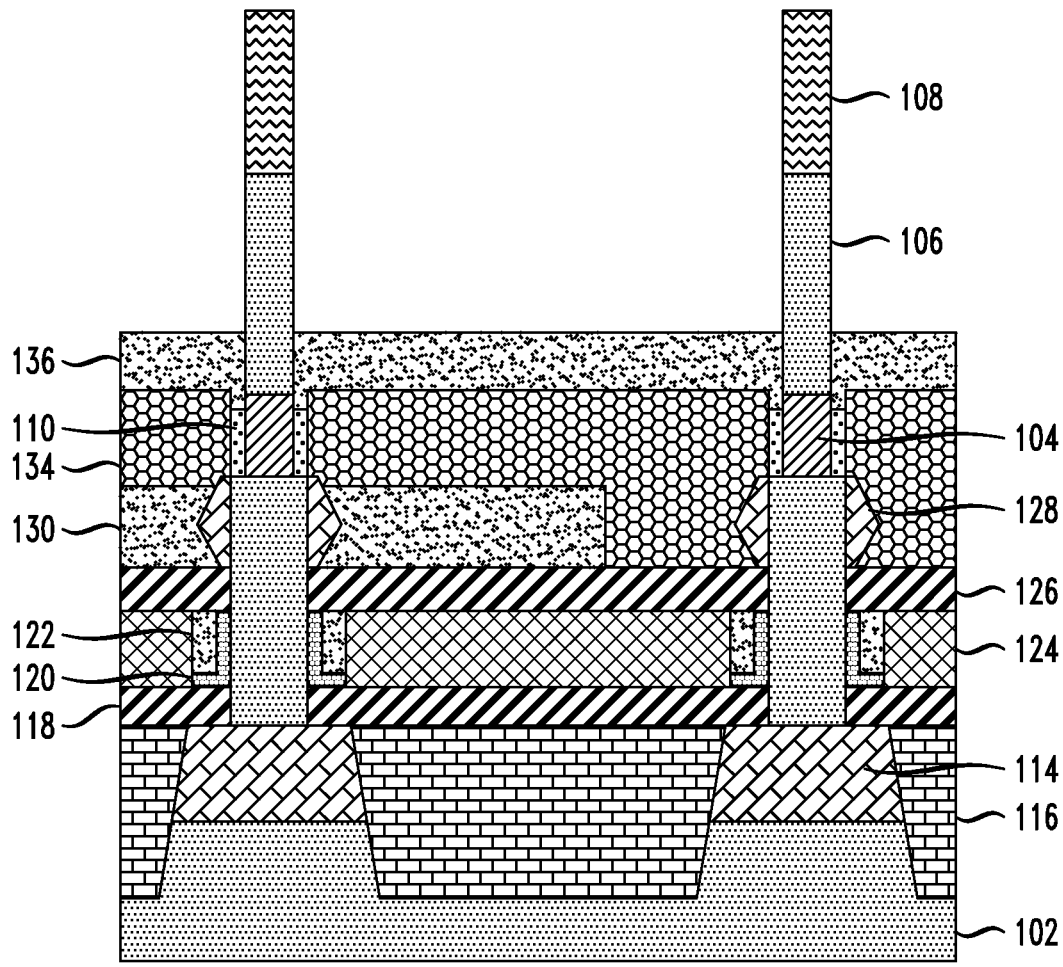
FIG. 13 depicts a cross-sectional view of the FIG. 12 structure following removal of the protection liner and formation of an oxide layer, according to an embodiment of the invention.

FIG. 13 shows a cross-sectional view 1300 of the FIG. 12 structure following removal of portions of the protection liner 110, and following deposition of an oxide layer 136. The protection liner 110 may be removed using selective RIE, wet etching or another suitable process. This may remove portions of the protection liner 110 that are above the ILD layer 134, and may extend to form small divots below the ILD layer 134 that are later filled with the oxide layer 136. The oxide layer 136 may be formed using any suitable deposition (and possible etch-back) processing. The oxide layer 136 has a height that controls the height of the bottom source/drain regions 140 formed as described below.

Figure 14:
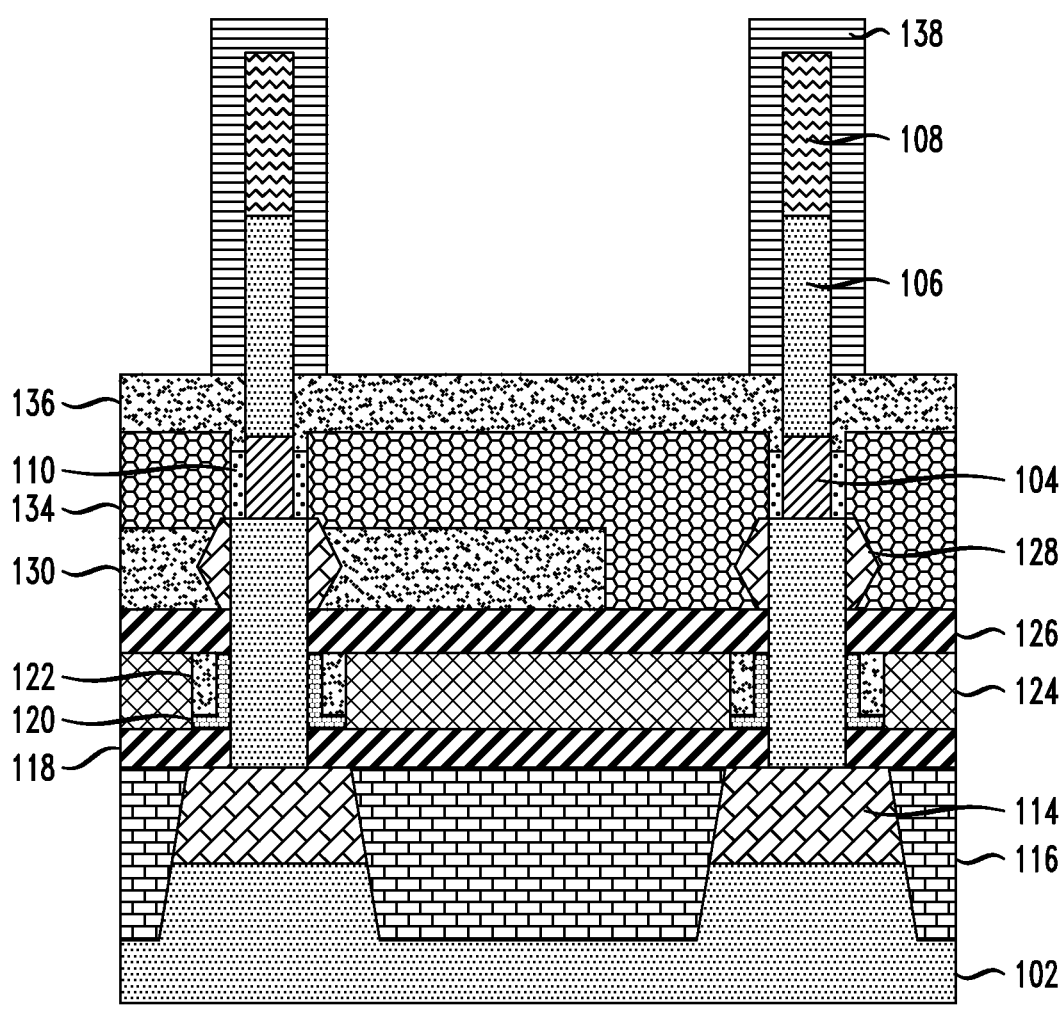
FIG. 14 depicts a cross-sectional view of the FIG. 13 structure following formation of an additional protection liner, according to an embodiment of the invention.

FIG. 14 shows a cross-sectional view 1400 of the FIG. 13 structure following formation of an additional protection liner 138 that protects the top portion of the vertical fins 201 above where the bottom source/drain regions 140 will be formed as described below with respect to FIG. 15. The protection liner 138 may be formed using processing and with materials similar to that of the protection liner 110. The protection liner 138 may have a thickness in the range of 3 nm to 5 nm.

Figure 15:
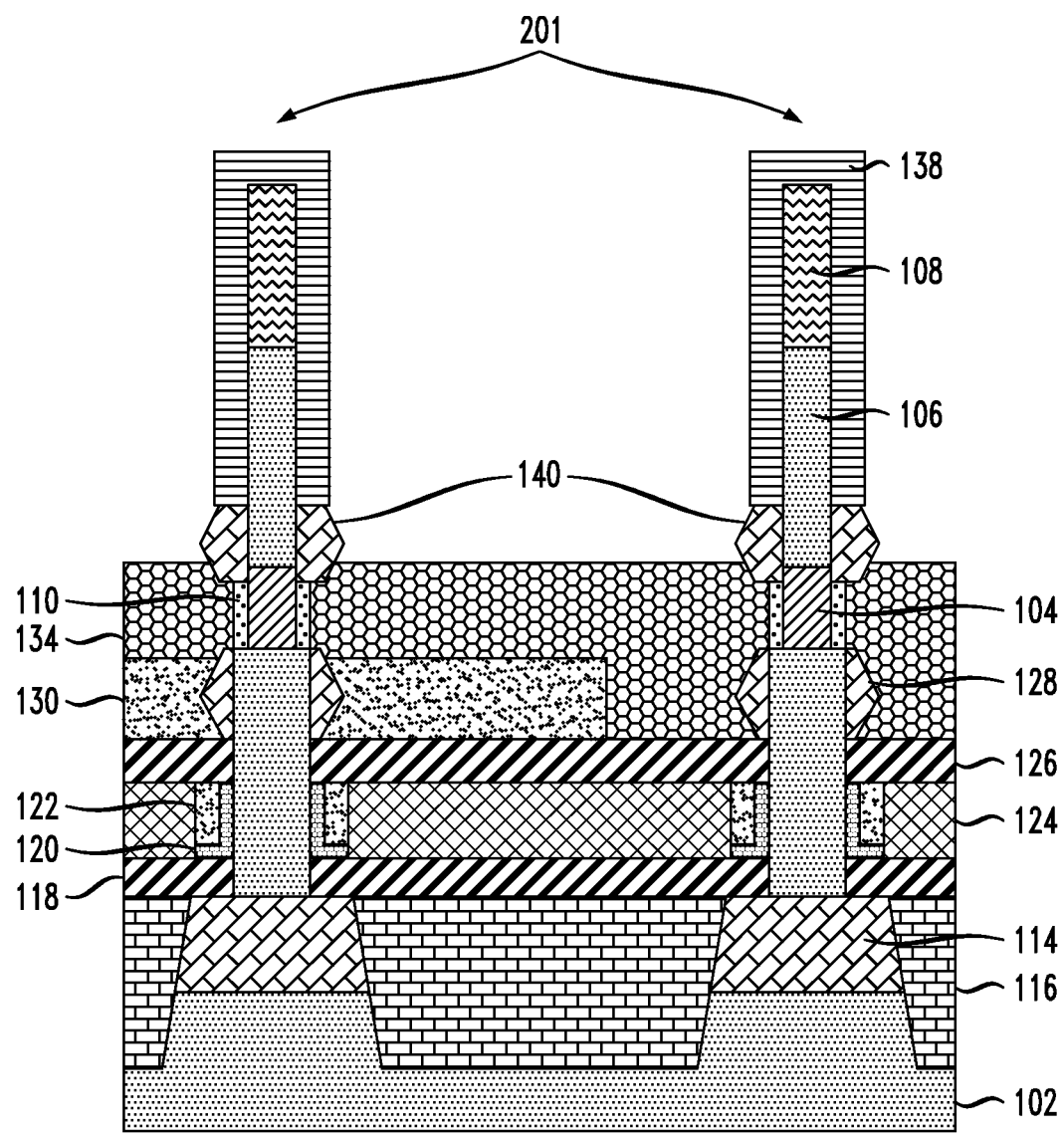
FIG. 15 depicts a cross-sectional view of the FIG. 14 structure following removal of the oxide layer and formation of bottom source/drain regions for the upper vertical transport field-effect transistors, according to an embodiment of the invention.

FIG. 15 shows a cross-sectional view 1500 of the FIG. 14 structure following removal of the oxide layer 136 and formation of bottom source/drain regions 140 for the upper VTFETs. The bottom source/drain regions 140 may be formed using processing similar to that of the bottom source/drain regions 114. The bottom source/drain regions 140 may have a height or vertical thickness (in direction Y-Y') in the range of 10 to 30 nm, and may have a width or horizontal thickness (in direction X-X') in the range of 5 to 15 nm.

Figure 16:
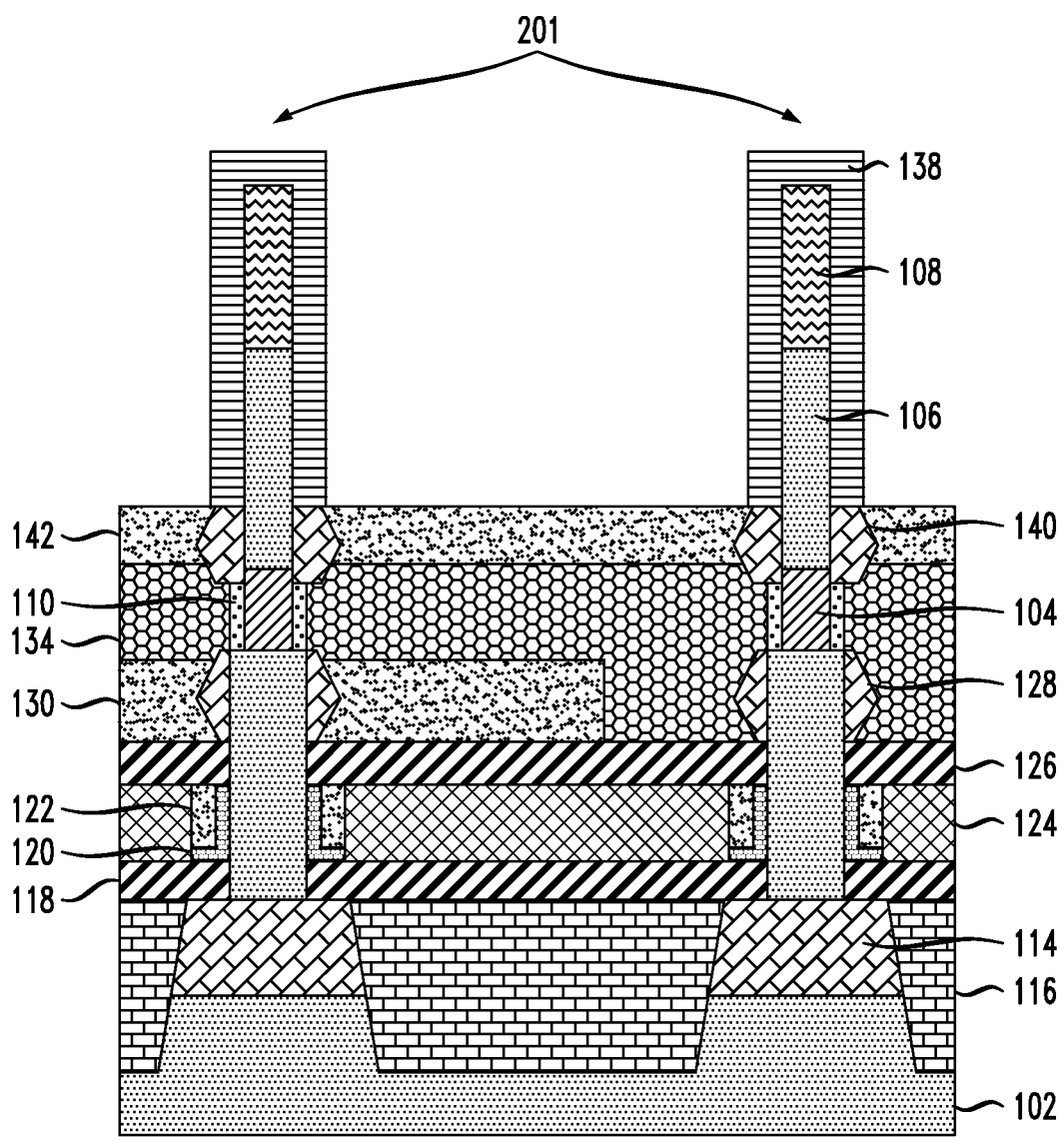
FIG. 16 depicts a cross-sectional view of the FIG. 15 structure following formation of a sacrificial oxide layer, according to an embodiment of the invention.

FIG. 16 shows a cross-sectional view 1600 of the FIG. 15 structure following formation of a sacrificial oxide layer 142. The sacrificial oxide layer 142 may be used to form contacts to the bottom source/drain regions 140 of the upper VTFETs. As described above, a vertical via and horizontal tunnels may be formed to provide a shared contact to the bottom source/drain regions 140 of the upper VTFETs and the top source/drain region of the "left" bottom VTFET to provide an output node for a NAND gate. It should be appreciated, however, that this is merely an example of MOL wiring for a stacked VTFET structure, and that embodiments are not limited to forming NAND gates using stacked VTFET structures.

The sacrificial oxide layer 142 may be patterned, as the contact to the bottom source/drain regions 140 may be limited to only a portion of the bottom source/drain regions 140. The particular way in which the sacrificial oxide layer 142 is patterned will vary based on the type of structure that is formed using the stacked VTFETs. The sacrificial oxide layer 142 may initially be formed over the entire structure, followed by patterning a mask over the sacrificial oxide layer 142 and removal of exposed portions of the sacrificial oxide layer 142 such that the sacrificial oxide layer remains only in the regions necessary for forming appropriate contacts in downstream processing. FIGS. 17A through 17E show a set of cross-sectional views illustrating contact formation for a NAND gate formed using the stacked VTFET structure.

Figures 17A, 17B:
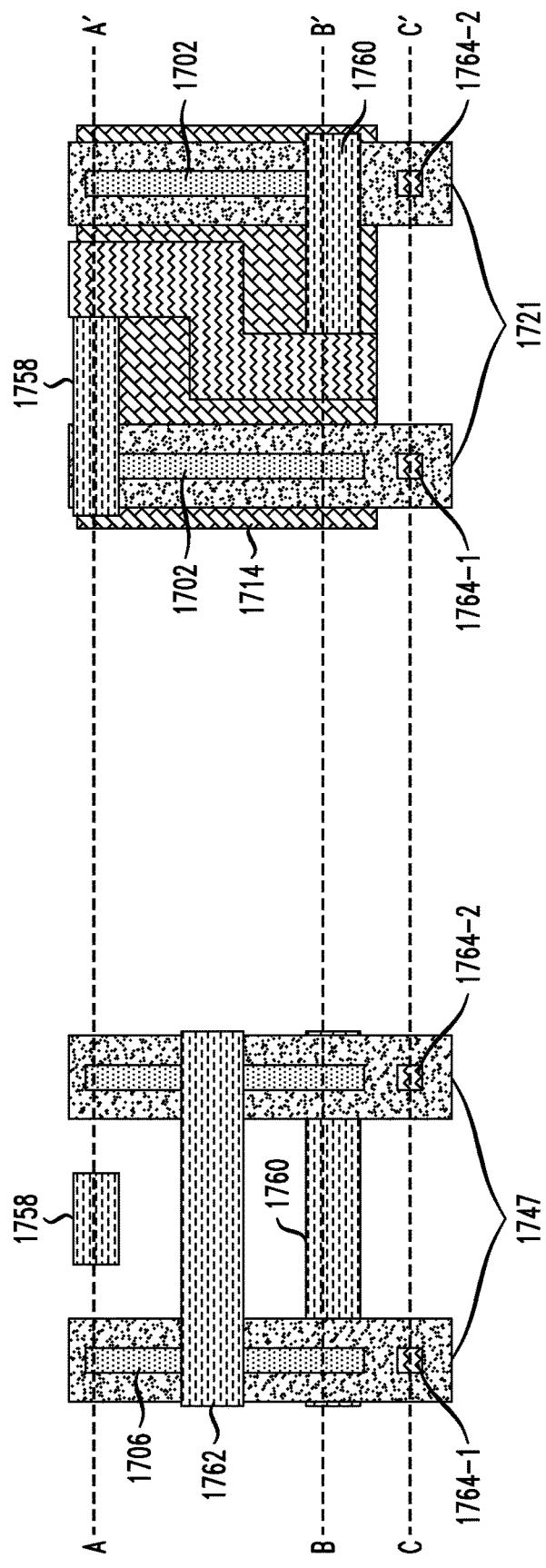
FIG. 17A depicts a first cross-sectional view of contacts for a NAND logic gate, according to an embodiment of the invention.
FIG. 17B depicts a second cross-sectional view of contacts for a NAND logic gate, according to an embodiment of the invention.

FIG. 17A shows a first "top-down" cross-sectional view 1700 that is taken across the upper VTFETs of a stacked VTFET structure (e.g., which shows a layout of the upper VTFETs), which are assumed in this example to be pFETs. FIG. 17B shows a second "top-down" cross-sectional view 1750 that is taken across the lower VTFETs of the stacked VTFET structure (e.g., which shows a layout of the lower VTFETs), which are assumed in this example to be nFETs. FIG. 17C shows a third "side" cross-sectional view 1775 that is taken along the line A-A' of FIGS. 17A and 17B. FIG. 17D shows a fourth "side" cross-sectional view 1785 that is taken along the line B-B' of FIGS. 17A and 17B. FIG. 17E shows a fifth "side" cross-sectional view 1795 that is taken along the line C-C' of FIGS. 17A and 17B. Similar numbering in FIGS. 17A through 17E is used to denote similar elements in the FIG. 16 structure—substrate 1702 providing the bottom portion of the fins is similar to substrate 102, isolation layer 1704 is similar to isolation layer 104, semiconductor layer 1706 providing the upper portion of the fins is similar to semiconductor layer 106, and bottom source/drain region 1714 is similar to bottom source/drain region 114. Reference numeral 1721 is used to denote the gate stack for the lower VTFETs and reference numeral 1747 is used to denote the gate stack for the upper VTFETs.

Contact 1758 is provided to the top source/drain region (not shown) for the "left" lower VTFET. The sacrificial oxide layer 142 may be used to pattern and provide for this contact, which may be to a ground (GND) connection for the NAND gate structure of FIGS. 17A through 17E. The cross-sectional view 1600 of FIG. 16 is thus taken "along" the line A-A' similar to the side cross-sectional view 1775 of FIG. 17C. If the cross-sectional view 1600 of FIG. 16 were taken along line B-B', then the sacrificial oxide layer 142 would connect to the top source/drain region of the "right" lower VTFET (as well as the bottom source/drain regions for the upper VTFETs) to provide for the contact 1760 as shown in the side cross-sectional view 1785 of FIG. 17D. The contact 1760 may provide for an output of the NAND gate. Various other patterning of sacrificial oxide layer 142 may be used in other regions of the stacked VTFET structure as needed to form appropriate contacts for a NAND gate or for other types of devices (e.g., a NOR logic gate, an inverter, etc.).

Contact 1762 is formed to the top source/drain regions of the upper VTFETs, and may provide a connection to a positive supply voltage (e.g., VDD) for the NAND gate. Contacts 1764-1 and 1764-2 provide for first and second input connections for the NAND gate, and contact the gate stacks 1721 and 1747 as illustrated in the side cross-sectional view 1795 of FIG. 17E.

It should be appreciated that the particular contact arrangement shown in FIGS. 17A through 17E is presented by way of example only, and that embodiments are not limited to using a stacked VTFET structure for forming a NAND gate. In other embodiments, for example, a stacked VTFET structure may be used to form a NOR gate. For the NOR gate, the ground contact is to the bottom source/drain regions of the lower VTFETs, the output contact is to the top source/drain regions of the lower VTFETs and the top source/drain region of one of the upper VTFETs, the positive voltage supply contact is to the bottom source/drain regions of the upper VTFETs and the top source/drain region of the other one of the upper VTFETs, and the first and second inputs are similar to those shown for the NAND gate. For an inverter, which requires only one vertical fin, the ground contact is to the bottom source/drain region of the lower VTFET, the output contact is to the top source/drain region of the lower VTFET and the bottom source/drain region of the upper VTFET, the positive voltage supply contact is to the top source/drain region of the upper VTFET, and the input is to the gate stacks of the upper and lower VTFETs. Various other contact arrangements may be used for other types of devices formed using stacked VTFET structures.

Figure 18:
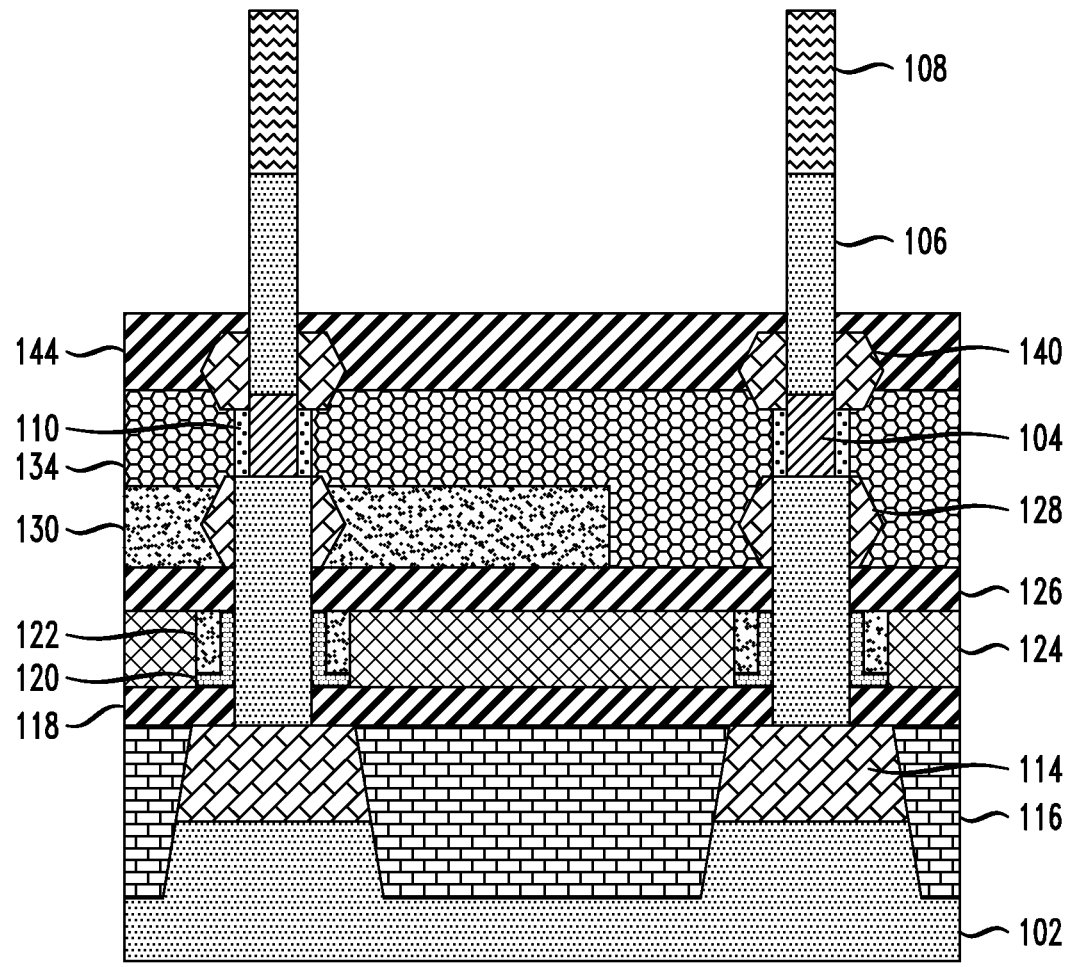
FIG. 18 depicts a cross-sectional view of the FIG. 16 structure after patterning of the sacrificial oxide layer, removal of the protection liner, and following formation of a bottom spacer, according to an embodiment of the invention.

FIG. 18 shows a cross-sectional view 1800 of the FIG. 16 structure after patterning of the sacrificial oxide layer 142, removal of the protection liner 138, and following formation of a bottom spacer 144 for the upper VTFETs surrounding the bottom source/drain regions 140 of the upper VTFETs. The cross-sectional view 1800 is taken along line A-A' in the top-down view 1700 of FIG. 17 (e.g., in a region were the sacrificial oxide layer 142 was previously removed). The bottom spacer 144 may be formed of similar materials as the bottom spacer 118. The bottom spacer 144 may have a height or vertical thickness (in direction Y-Y') in the range of 10 to 30 nm, provided that the bottom spacer 126 must be formed with a greater height than that of the bottom source/drain regions 140 so as to provide a buffer between the bottom source/drain regions 140 and the gate stack of the upper VTFETs.

After formation of the bottom spacer 144, the FIG. 18 structure may undergo dopant drive-in for the bottom source/drain regions 140 of the upper VTFETs (e.g., the pFET bottom source/drain regions) and the top source/drain regions 128 and bottom source/drain regions 114 of the lower VTFETs (e.g., the nFET top and bottom source/drain regions) using a RTA anneal. The dopant drive-in for the bottom source/drain regions 114, top source/drain regions 128, and bottom source/drain regions 140 is advantageously done at the same time using the RTA anneal. The dopant drive-in for the bottom source/drain regions 114, top source/drain regions 128 and bottom source/drain regions 140 is performed prior to formation of the gate stack for the upper VTFETs, as the gate stack for the upper VTFETs (e.g., the pFET gate stack) should not be exposed to high temperatures (e.g., temperatures in the range of 900 to 1100 degrees Celsius (° C.)) that are used during the dopant drive-in RTA anneal.

Figure 19:
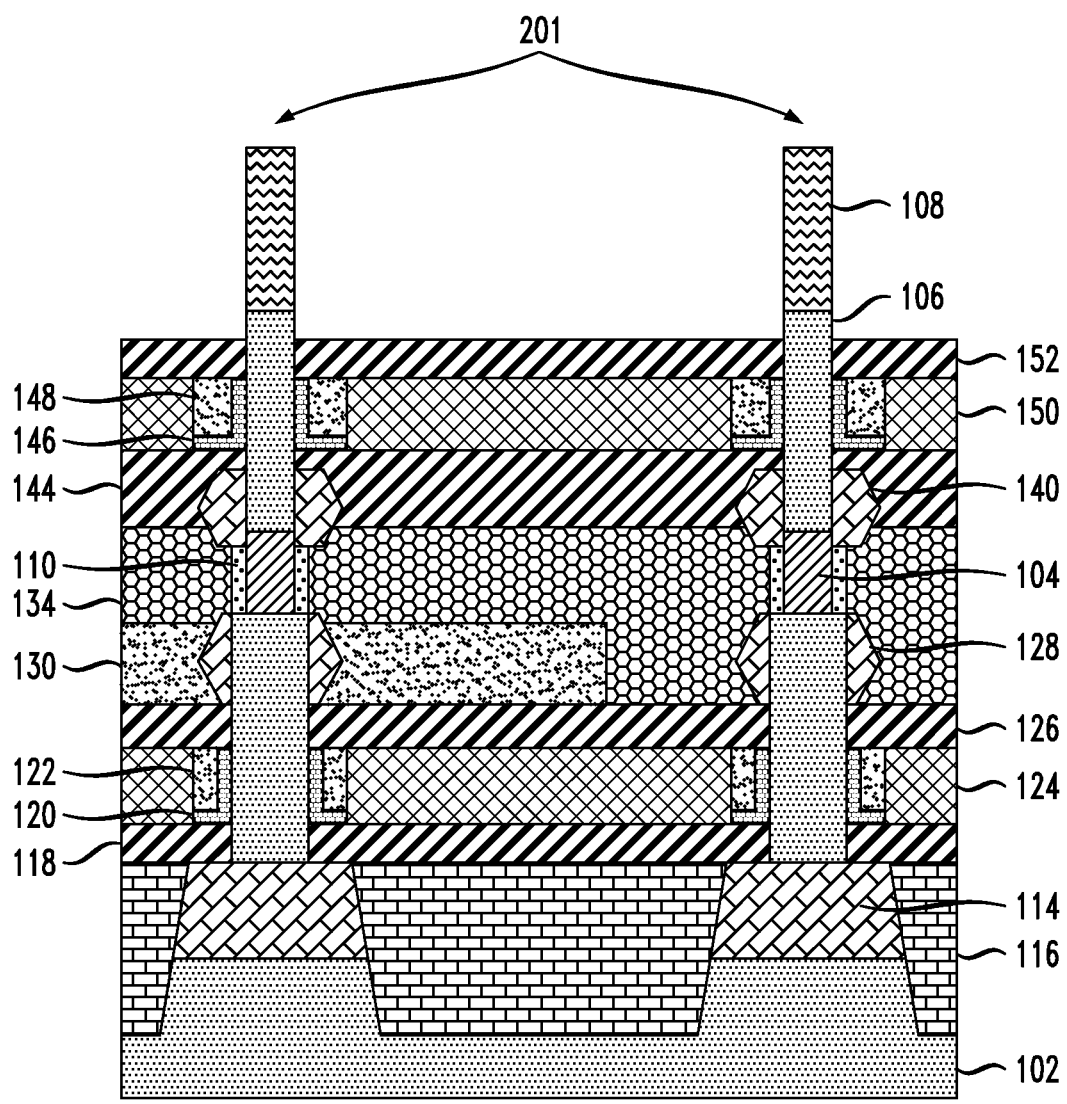
FIG. 19 depicts a cross-sectional view of the FIG. 18 structure following formation of the gate stack for the upper vertical transport field-effect transistors, an interlayer dielectric layer, and a top spacer, according to an embodiment of the invention.

FIG. 19 shows a cross-sectional view 1900 of the FIG. 18 structure following formation of the gate stack for the upper VTFETs including gate dielectric layer 146 and gate conductor layer 148, and following formation of an ILD layer 150 and top spacer 152 for the upper VTFETs. The gate dielectric layer 146 and gate conductor layer 148 of the gate stack for the upper VTFETs may be formed of similar materials, with similar sizing and similar processing as that described above with respect to the gate dielectric layer 120 and gate conductor layer 122 of the gate stack for the lower VTFETs. More particularly, the gate conductor layer 148 is assumed to be formed of a same material as the gate conductor layer 122 (e.g., the same WFM material such as TiN). As described above, the gate conductor layer 148 is un-annealed whereas the gate conductor layer 122 is annealed. By un-annealed, it is meant that the gate conductor layer 148 is not exposed to a RTA (e.g., a high temperature anneal). The gate conductor layer 148, as will be described in further detail below, is exposed to a laser anneal, which has a lower thermal budget that does not affect the gate stack for the upper VTFETs.

The ILD layer 150 may be formed of similar materials, with similar sizing and similar processing as that described above with respect to ILD layer 124. The top spacer 152 for the upper VTFETs may be formed of similar materials, with similar sizing and similar processing as that described above for the top spacer 126 of the lower VTFETs.

Although not shown, an interfacial layer may be formed between the gate stacks of the upper and lower VTFETs and the sidewalls of the bottom and top portions of the vertical fins 201 on which the gate stacks are formed. The interfacial layer may be formed of $SiO_2$ or another suitable material such as silicon oxynitride ($SiO_xN_y$). The interfacial layer may have a width or horizontal thickness (in direction X-X') ranging from 0.5 nm to 1.5 nm.

In some embodiments, the gate stack for the upper VTFETs may be formed as follows. First, the gate dielectric layer 148 may be deposited, followed by deposition of a capping layer (e.g., of TiN) and deposition of an a-Si layer. The structure is then exposed to a reliability anneal (e.g., a 950° C. RTA or laser anneal), after which the a-Si layer and the capping layer are removed. The gate conductor layer 150 (e.g., which may be formed of a pFET WFM such as TiN) is then deposited.

Figure 20:
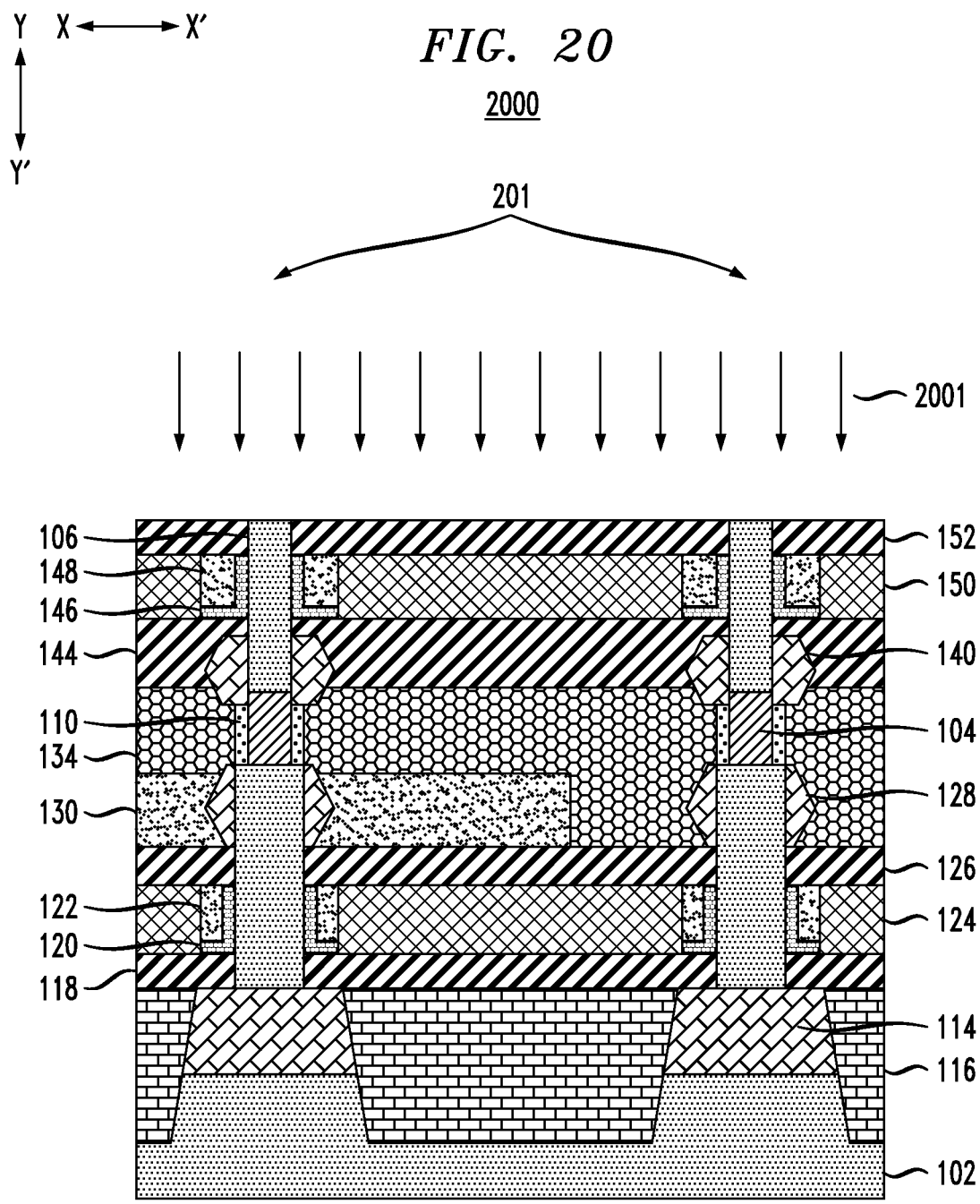
FIG. 20 depicts a cross-sectional view of the FIG. 19 structure following removal of the hard mask layer and dopant drive-in for a top junction of the upper vertical transport field-effect transistors, according to an embodiment of the invention.

FIG. 20 shows a cross-sectional view 2000 of the FIG. 19 structure following removal of the HM layer 108, recess of the top of the vertical fins 201, and dopant drive-in 2001 for a top junction of the upper VTFETs. The HM layer 108 is removed using selective wet etching. The vertical fins 201 are then recessed such that a top surface of the vertical fins 201 matches the top surface of the top spacer 152. The dopant drive-in 2001 includes ion implantation followed by a laser spike anneal (LSA) to set the top junction for the upper VTFETs. A RTA is not used to set the top junction to protect the gate stack of the upper VTFETs, as the upper VTFETs are assumed to be pFETs and the gate stack for the pFETs would be damaged by a RTA. It should be noted that, without the dopant drive-in 2001, there is a significant resistance penalty.

Figure 21:
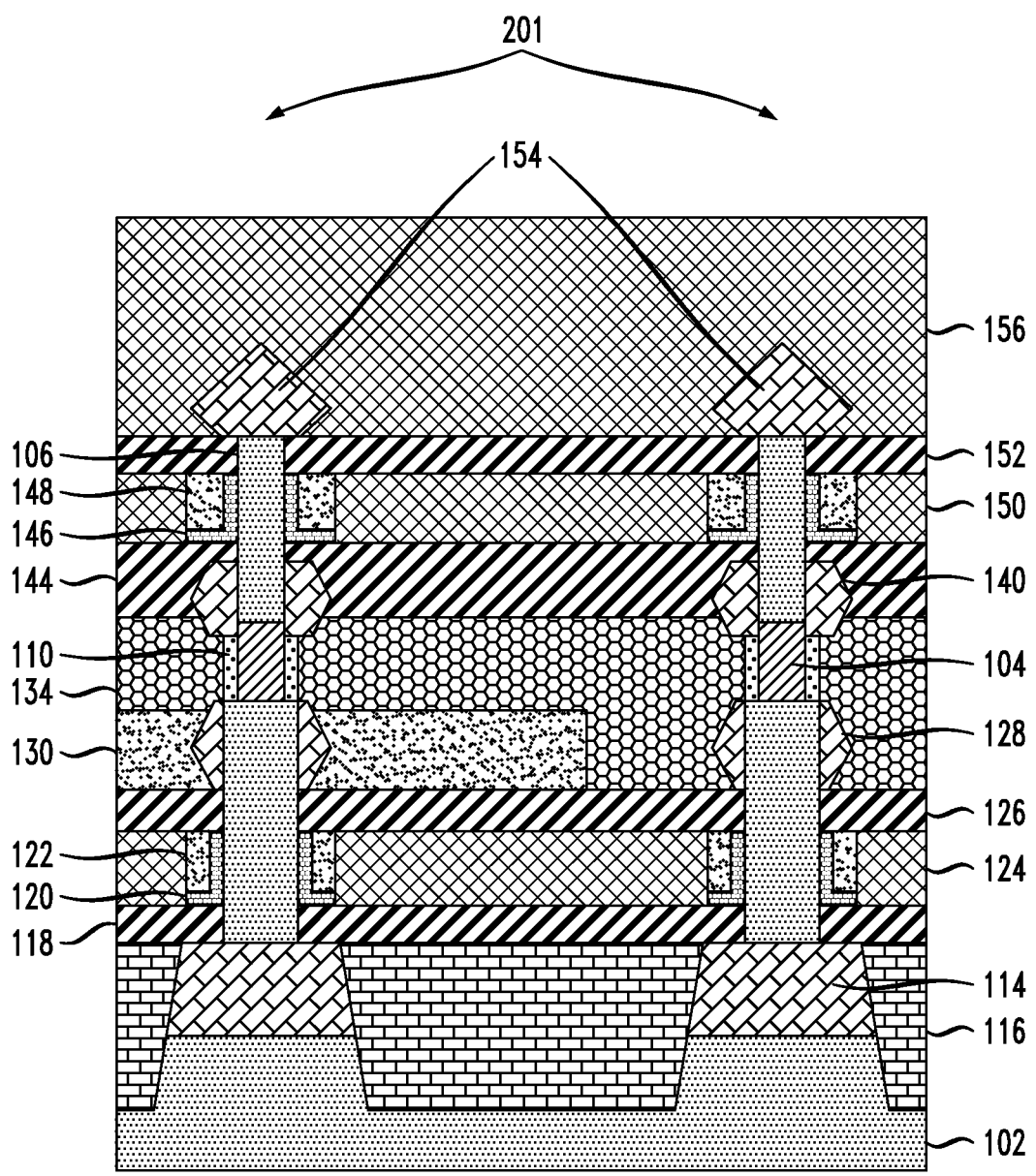
FIG. 21 depicts a cross-sectional view of the FIG. 20 structure following formation of top source/drain regions for the upper vertical transport field-effect transistors, according to an embodiment of the invention.

FIG. 21 shows a cross-sectional view 2100 of the FIG. 20 structure following formation of top source/drain regions 154 for the upper VTFETs. The top source/drain regions 154 are formed over the top surfaces of the vertical fins 201. The top source/drain regions 154 may be formed of similar materials and using similar processing as that described above with respect to bottom source/drain regions 114. The top source/drain regions 154 may have a height or vertical thickness (in direction Y-Y') in the range of 10 to 30 nm, and may have a width or horizontal thickness (in direction X-X') in the range of 10 to 30 nm. After formation of the top source/drain regions 154, a short laser anneal (e.g., with a duration in the range of 10 nanoseconds to 10 milliseconds at a temperature of about 1200° C.) is performed. Advantageously, the laser anneal is very short and has a thermal budget that avoids damage to the gate stack of the upper VTFETs. An ILD layer 156 may then be formed over the top source/drain regions 154, followed by additional processing to form contacts for the upper and lower VTFETs. The ILD layer 156 may be formed of similar materials as the ILD layer 124. The ILD layer 156, as shown in FIG. 21, overfills the structure, and may have a height or vertical thickness (in direction Y-Y') that exceeds the top surfaces of the top source/drain regions 154, such as a height or vertical thickness in the range of 30 to 70 nm.

In some embodiments, a method of forming a semiconductor structure comprises forming one or more vertical fins each comprising a first semiconductor layer providing a vertical transport channel for a lower VTFET of a stacked VTFET structure, an isolation layer over the first semiconductor layer, and a second semiconductor layer over the isolation layer providing a vertical transport channel for an upper VTFET of the stacked VTFET structure. The method also comprises forming a first gate stack comprising a first gate dielectric layer and a first gate conductor layer surrounding a portion of the first semiconductor layer of each of the one or more vertical fins. The method further comprises forming a second gate stack comprising a second gate dielectric layer and a second gate conductor layer surrounding a portion of the second semiconductor layer of each of the one or more vertical fins. The first gate conductor layer and the second gate conductor layer comprise a same material.

Forming the first gate stack may comprise utilizing a gate-first process and forming the second gate stack may comprise utilizing a gate-last process.

The first gate conductor layer may be annealed and the second gate conductor layer may be un-annealed. The lower VTFET may comprise an nFET and the upper VTFET may comprise a pFET.

The first gate conductor layer may comprise a given WFM that is annealed and the second gate conductor layer comprises the given WFM that is un-annealed. The given WFM may comprise TiN.

Forming the first gate stack may comprise forming the first gate dielectric layer over the one or more vertical fins and a first bottom spacer surrounding a portion of the first semiconductor layer of the one or more vertical fins, forming the first gate conductor layer over the first gate dielectric layer, forming an amorphous silicon layer over the first gate conductor layer, performing a reliability anneal, removing the amorphous silicon layer, performing a gate cut etch to remove portions of the first gate dielectric layer and the first gate conductor layer formed over portions of the first bottom spacer spaced apart from sidewalls of the one or more vertical fins, forming an interlayer dielectric layer over the first bottom spacer surrounding a portion of the first gate dielectric layer and the first gate conductor layer, and recessing the first gate dielectric layer and the first gate conductor layer to a top surface of the interlayer dielectric layer to provide the first gate stack.

Forming the second gate stack may comprise forming the second gate dielectric layer over the one or more vertical fins and a second bottom spacer surrounding a portion of the second semiconductor layer of the one or more vertical fins, forming a capping layer over the second gate dielectric layer, forming an amorphous silicon layer over the capping layer, performing a reliability anneal, removing the amorphous silicon layer and the capping layer, forming the second gate conductor layer over the second gate dielectric layer, performing a gate cut etch to remove portions of the second gate dielectric layer and the second gate conductor layer formed over portions of the second bottom spacer spaced apart from sidewalls of the one or more vertical fins, forming an interlayer dielectric layer over the second bottom spacer surrounding a portion of the second gate dielectric layer and the second gate conductor layer, and recessing the second gate dielectric layer and the second gate conductor layer to a top surface of the interlayer dielectric layer to provide the second gate stack.

The method may further comprise performing a RTA to provide dopant drive-in at the same time for (i) first bottom source/drain regions of the lower VTFET, (ii) first top source/drain regions of the lower VTFET and (iii) second bottom source/drain regions of the upper VTFET.

The method may further comprise patterning a hard mask layer over a top surface of the second semiconductor layer, etching the second semiconductor layer and the isolation layer exposed by the patterned hard mask layer to form a first portion of the one or more vertical fins, forming a first liner on sidewalls of the first portion of the one or more vertical fins, etching exposed portions of a substrate below the isolation layer to provide a first portion of the first semiconductor layer of the one or more vertical fins, forming a second liner on sidewalls of the first portion of the first semiconductor layer of the one or more vertical fins and on sidewalls of the first liner, etching exposed portions of the substrate below the second liner to provide a second portion of the first semiconductor layer of the one or more vertical fins, and trimming sidewalls of the second portion of the first semiconductor layer of the one or more vertical fins to match sidewalls of the first portion of the first semiconductor layer of the one or more vertical fins.

The method may further comprise forming first bottom source/drain regions over a top surface of the substrate and surrounding the second portion of the first semiconductor layer of the one or more vertical fins, removing the second liner, patterning the first bottom source/drain regions, forming shallow trench isolation regions surrounding the first bottom source/drain regions, and forming a first bottom spacer over the first bottom source/drain regions and the shallow trench isolation regions.

Forming the first gate stack may comprise forming the first gate dielectric layer over the one or more vertical fins and the first bottom spacer, forming the first gate conductor layer over the first gate dielectric layer, forming an amorphous silicon layer over the first gate conductor layer, performing a reliability anneal, removing the amorphous silicon layer, performing a gate cut etch to remove portions of the first gate dielectric layer and the first gate conductor layer formed over the hard mask layer and over portions of the first bottom spacer, forming a first interlayer dielectric layer over the first bottom spacer surrounding a portion of the first gate dielectric layer and the first gate conductor layer, and recessing the first gate dielectric layer and the first gate conductor layer to a top surface of the first interlayer dielectric layer to provide the first gate stack.

The method may further comprise forming a first top spacer over the first gate stack and the first interlayer dielectric layer, forming first top source/drain regions surrounding a remainder of the second portion of the first semiconductor layer over the first top spacer, forming a second interlayer dielectric layer surrounding the first top source/drain regions, the isolation layer and a first portion of the second semiconductor layer of the one or more vertical fins, removing the first liner, forming an oxide layer over the second interlayer dielectric layer, forming a third liner on exposed sidewalls of the second semiconductor layer and the hard mask layer of the one or more vertical fins, removing the oxide layer, forming second bottom source/drain regions surrounding exposed sidewalls of the second semiconductor layer below the third liner, forming a second bottom spacer surrounding the second bottom source/drain regions, and performing a RTA to provide dopant drive-in for the first bottom source/drain regions, the first top source/drain regions and the second bottom source/drain regions.

Forming the second gate stack may comprise forming the second gate dielectric layer over the one or more vertical fins and the second bottom spacer, forming a capping layer over the second gate dielectric layer, forming an additional amorphous silicon layer over the capping layer, performing an additional reliability anneal, removing the additional amorphous silicon layer and the capping layer, forming the second gate conductor layer over the second gate dielectric layer, performing an additional gate cut etch to remove portions of the second gate dielectric layer and the second gate conductor layer formed over the hard mask layer and over portions of the second bottom spacer, forming a third interlayer dielectric layer over the second bottom spacer surrounding a portion of the second gate dielectric layer and the second gate conductor layer, and recessing the second gate dielectric layer and the second gate conductor layer to a top surface of the third interlayer dielectric layer to provide the second gate stack.

The method may further comprise removing the hard mask layer, recessing a top surface of the second semiconductor layer to match a top surface of the third interlayer dielectric layer, performing ion implantation and a laser spike anneal to form a top junction in the top surface of the second semiconductor layer of the one or more vertical fins, forming second top source/drain regions over the top surface of the second semiconductor layer of the one or more vertical fins, and performing a laser anneal.

In some embodiments, a semiconductor structure comprises one or more vertical fins each comprising a first semiconductor layer providing a vertical transport channel for a lower VTFET of a stacked VTFET structure, an isolation layer over the first semiconductor layer, and a second semiconductor layer over the isolation layer providing a vertical transport channel for an upper VTFET of the stacked VTFET structure. The semiconductor structure also comprises a first gate stack comprising a first gate dielectric layer and a first gate conductor layer surrounding a portion of the first semiconductor layer of each of the one or more vertical fins. The semiconductor structure further comprises a second gate stack comprising a second gate dielectric layer and a second gate conductor layer surrounding a portion of the second semiconductor layer of each of the one or more vertical fins. The first gate conductor layer and the second gate conductor layer comprise a same material.

The first gate conductor layer may be annealed and the second gate conductor layer may be un-annealed. The lower VTFET may comprise an nFET and the upper VTFET may comprise a pFET.

The first gate conductor layer may comprise a given WFM that is annealed and the second gate conductor layer may comprise the given WFM that is un-annealed. The given WFM may comprise TiN.

In some embodiments, an integrated circuit comprises a stacked VTFET structure. The stacked VTFET structure comprises one or more vertical fins each comprising a first semiconductor layer providing a vertical transport channel for a lower VTFET of the stacked VTFET structure, an isolation layer over the first semiconductor layer, and a second semiconductor layer over the isolation layer providing a vertical transport channel for an upper VTFET of the stacked VTFET structure. The stacked VTFET structure also comprises a first gate stack comprising a first gate dielectric layer and a first gate conductor layer surrounding a portion of the first semiconductor layer of each of the one or more vertical fins. The stacked VTFET structure further comprises a second gate stack comprising a second gate dielectric layer and a second gate conductor layer surrounding a portion of the second semiconductor layer of each of the one or more vertical fins. The first gate conductor layer and the second gate conductor layer comprise a same material.

The first gate conductor layer may be annealed and the second gate conductor layer may be un-annealed. The lower VTFET may comprise an nFET and the upper VTFET may comprise a pFET.

The first gate conductor layer may comprise a given WFM that is annealed and the second gate conductor layer may comprise the given WFM that is un-annealed. The given WFM may comprise TiN.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:

forming one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure;

forming first bottom source/drain regions of the lower vertical transport field-effect transistor;

forming a first gate stack comprising a first gate dielectric layer and a first gate conductor layer surrounding a portion of the first semiconductor layer of each of the one or more vertical fins;

forming first top source/drain regions of the lower vertical transport field-effect transistor;

forming second bottom source/drain regions of the upper vertical transport field-effect transistor;

forming a second gate stack comprising a second gate dielectric layer and a second gate conductor layer surrounding a portion of the second semiconductor layer of each of the one or more vertical fins;

wherein the first gate conductor layer and the second gate conductor layer comprise a same material; and performing a rapid thermal anneal to provide dopant drive-in at the same time for (i) the first bottom source/drain regions of the lower vertical transport field-effect transistor, (ii) the first top source/drain regions of the lower vertical transport field-effect transistor and (iii) the second bottom source/drain regions of the upper vertical transport field-effect transistor.

2. The method of claim 1, wherein forming the first gate stack comprises utilizing a gate-first process and wherein forming the second gate stack comprises utilizing a gate-last process.

3. The method of claim 1, wherein the first gate conductor layer is annealed and the second gate conductor layer is un-annealed.

4. The method of claim 3, wherein the lower vertical transport field-effect transistor comprises an n-type field-effect transistor and the upper vertical transport field-effect transistor comprises a p-type field-effect transistor.

5. The method of claim 1, wherein the first gate conductor layer comprises a given work function metal that is annealed and the second gate conductor layer comprises the given work function metal that is un-annealed.

6. The method of claim 5, wherein the given work function metal comprises titanium nitride (TiN).

7. The method of claim 1, wherein forming the first gate stack comprises:

forming the first gate dielectric layer over the one or more vertical fins and a first bottom spacer surrounding a portion of the first semiconductor layer of the one or more vertical fins;

forming the first gate conductor layer over the first gate dielectric layer;

forming an amorphous silicon layer over the first gate conductor layer;

performing a reliability anneal;

removing the amorphous silicon layer;

performing a gate cut etch to remove portions of the first gate dielectric layer and the first gate conductor layer formed over portions of the first bottom spacer spaced apart from sidewalls of the one or more vertical fins;

forming an interlayer dielectric layer over the first bottom spacer surrounding a portion of the first gate dielectric layer and the first gate conductor layer; and recessing the first gate dielectric layer and the first gate conductor layer to a top surface of the interlayer dielectric layer to provide the first gate stack.

8. The method of claim 1, wherein forming the second gate stack comprises:
forming the second gate dielectric layer over the one or more vertical fins and a second bottom spacer surrounding a portion of the second semiconductor layer of the one or more vertical fins;
forming a capping layer over the second gate dielectric layer;
forming an amorphous silicon layer over the capping layer;
performing a reliability anneal;
removing the amorphous silicon layer and the capping layer;
forming the second gate conductor layer over the second gate dielectric layer;
performing a gate cut etch to remove portions of the second gate dielectric layer and the second gate conductor layer formed over portions of the second bottom spacer spaced apart from sidewalls of the one or more vertical fins;
forming an interlayer dielectric layer over the second bottom spacer surrounding a portion of the second gate dielectric layer and the second gate conductor layer; and
recessing the second gate dielectric layer and the second gate conductor layer to a top surface of the interlayer dielectric layer to provide the second gate stack.

9. The method of claim 1, further comprising:
patterning a hard mask layer over a top surface of the second semiconductor layer;
etching the second semiconductor layer and the isolation layer exposed by the patterned hard mask layer to form a first portion of the one or more vertical fins;
forming a first liner on sidewalls of the first portion of the one or more vertical fins;
etching exposed portions of a substrate below the isolation layer to provide a first portion of the first semiconductor layer of the one or more vertical fins;
forming a second liner on sidewalls of the first portion of the first semiconductor layer of the one or more vertical fins and on sidewalls of the first liner;
etching exposed portions of the substrate below the second liner to provide a second portion of the first semiconductor layer of the one or more vertical fins; and
trimming sidewalls of the second portion of the first semiconductor layer of the one or more vertical fins to match sidewalls of the first portion of the first semiconductor layer of the one or more vertical fins.

10. The method of claim 9, further comprising:
forming the first bottom source/drain regions over a top surface of the substrate and surrounding the second portion of the first semiconductor layer of the one or more vertical fins;
removing the second liner;
patterning the first bottom source/drain regions;
forming shallow trench isolation regions surrounding the first bottom source/drain regions; and
forming a first bottom spacer over the first bottom source/drain regions and the shallow trench isolation regions.

11. The method of claim 10, wherein forming the first gate stack comprises:
forming the first gate dielectric layer over the one or more vertical fins and the first bottom spacer;
forming the first gate conductor layer over the first gate dielectric layer;
forming an amorphous silicon layer over the first gate conductor layer;
performing a reliability anneal;
removing the amorphous silicon layer;
performing a gate cut etch to remove portions of the first gate dielectric layer and the first gate conductor layer formed over the hard mask layer and over portions of the first bottom spacer;
forming a first interlayer dielectric layer over the first bottom spacer surrounding a portion of the first gate dielectric layer and the first gate conductor layer; and
recessing the first gate dielectric layer and the first gate conductor layer to a top surface of the first interlayer dielectric layer to provide the first gate stack.

12. The method of claim 11, further comprising:
forming a first top spacer over the first gate stack and the first interlayer dielectric layer;
forming first top source/drain regions surrounding a remainder of the first portion of the first semiconductor layer over the first top spacer;
forming a second interlayer dielectric layer surrounding the first top source/drain regions, the isolation layer and a first portion of the second semiconductor layer of the one or more vertical fins;
removing the first liner;
forming an oxide layer over the second interlayer dielectric layer;
forming a third liner on exposed sidewalls of the second semiconductor layer and the hard mask layer of the one or more vertical fins;
removing the oxide layer;
forming second bottom source/drain regions surrounding exposed sidewalls of the second semiconductor layer below the third liner; and
forming a second bottom spacer surrounding the second bottom source/drain regions.

13. The method of claim 12, wherein forming the second gate stack comprises:
forming the second gate dielectric layer over the one or more vertical fins and the second bottom spacer;
forming a capping layer over the second gate dielectric layer;
forming an additional amorphous silicon layer over the capping layer;
performing an additional reliability anneal;
removing the additional amorphous silicon layer and the capping layer;
forming the second gate conductor layer over the second gate dielectric layer;
performing an additional gate cut etch to remove portions of the second gate dielectric layer and the second gate conductor layer formed over the hard mask layer and over portions of the second bottom spacer;
forming a third interlayer dielectric layer over the second bottom spacer surrounding a portion of the second gate dielectric layer and the second gate conductor layer; and
recessing the second gate dielectric layer and the second gate conductor layer to a top surface of the third interlayer dielectric layer to provide the second gate stack.

14. The method of claim 13, further comprising:
forming a second top spacer over the second gate dielectric layer, the second gate conductor layer, and third interlayer dielectric layer;
removing the hard mask layer;
recessing a top surface of the second semiconductor layer to match a top surface of the second top spacer;
performing ion implantation and a laser spike anneal to form a top junction in the top surface of the second semiconductor layer of the one or more vertical fins;
forming second top source/drain regions over the top surface of the second semiconductor layer of the one or more vertical fins; and
performing a laser anneal.

15. A method of forming a semiconductor structure, comprising:
forming one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure;
forming a first gate stack comprising a first gate dielectric layer and a first gate conductor layer surrounding a portion of the first semiconductor layer of each of the one or more vertical fins;
forming a second gate stack comprising a second gate dielectric layer and a second gate conductor layer surrounding a portion of the second semiconductor layer of each of the one or more vertical fins;
wherein the first gate conductor layer and the second gate conductor layer comprise a same material; and
wherein forming the first gate stack comprises:
forming the first gate dielectric layer over the one or more vertical fins and a first bottom spacer surrounding a portion of the first semiconductor layer of the one or more vertical fins;
forming the first gate conductor layer over the first gate dielectric layer;
forming an amorphous silicon layer over the first gate conductor layer;
performing a reliability anneal;
removing the amorphous silicon layer;
performing a gate cut etch to remove portions of the first gate dielectric layer and the first gate conductor layer formed over portions of the first bottom spacer spaced apart from sidewalls of the one or more vertical fins;
forming an interlayer dielectric layer over the first bottom spacer surrounding a portion of the first gate dielectric layer and the first gate conductor layer; and
recessing the first gate dielectric layer and the first gate conductor layer to a top surface of the interlayer dielectric layer to provide the first gate stack.

16. The method of claim 15, wherein forming the second gate stack comprises:
forming the second gate dielectric layer over the one or more vertical fins and a second bottom spacer surrounding a portion of the second semiconductor layer of the one or more vertical fins;
forming a capping layer over the second gate dielectric layer;
forming an amorphous silicon layer over the capping layer;
performing a reliability anneal;
removing the amorphous silicon layer and the capping layer;
forming the second gate conductor layer over the second gate dielectric layer;
performing a gate cut etch to remove portions of the second gate dielectric layer and the second gate conductor layer formed over portions of the second bottom spacer spaced apart from sidewalls of the one or more vertical fins;
forming an interlayer dielectric layer over the second bottom spacer surrounding a portion of the second gate dielectric layer and the second gate conductor layer; and
recessing the second gate dielectric layer and the second gate conductor layer to a top surface of the interlayer dielectric layer to provide the second gate stack.

17. A method of forming a semiconductor structure, comprising:
forming one or more vertical fins each comprising a first semiconductor layer providing a vertical transport channel for a lower vertical transport field-effect transistor of a stacked vertical transport field-effect transistor structure, an isolation layer over the first semiconductor layer, and a second semiconductor layer over the isolation layer providing a vertical transport channel for an upper vertical transport field-effect transistor of the stacked vertical transport field-effect transistor structure;
forming a first gate stack comprising a first gate dielectric layer and a first gate conductor layer surrounding a portion of the first semiconductor layer of each of the one or more vertical fins;
forming a second gate stack comprising a second gate dielectric layer and a second gate conductor layer surrounding a portion of the second semiconductor layer of each of the one or more vertical fins;
wherein the first gate conductor layer and the second gate conductor layer comprise a same material;
patterning a hard mask layer over a top surface of the second semiconductor layer;
etching the second semiconductor layer and the isolation layer exposed by the patterned hard mask layer to form a first portion of the one or more vertical fins;
forming a first liner on sidewalls of the first portion of the one or more vertical fins;
etching exposed portions of a substrate below the isolation layer to provide a first portion of the first semiconductor layer of the one or more vertical fins;
forming a second liner on sidewalls of the first portion of the first semiconductor layer of the one or more vertical fins and on sidewalls of the first liner;
etching exposed portions of the substrate below the second liner to provide a second portion of the first semiconductor layer of the one or more vertical fins; and
trimming sidewalls of the second portion of the first semiconductor layer of the one or more vertical fins to match sidewalls of the first portion of the first semiconductor layer of the one or more vertical fins.

18. The method of claim 17, further comprising:
forming first bottom source/drain regions over a top surface of the substrate and surrounding the second portion of the first semiconductor layer of the one or more vertical fins;

removing the second liner;
patterning the first bottom source/drain regions;
forming shallow trench isolation regions surrounding the first bottom source/drain regions; and
forming a first bottom spacer over the first bottom source/drain regions and the shallow trench isolation regions.

19. The method of claim 18, wherein forming the first gate stack comprises:
forming the first gate dielectric layer over the one or more vertical fins and the first bottom spacer;
forming the first gate conductor layer over the first gate dielectric layer;
forming an amorphous silicon layer over the first gate conductor layer;
performing a reliability anneal;
removing the amorphous silicon layer;
performing a gate cut etch to remove portions of the first gate dielectric layer and the first gate conductor layer formed over the hard mask layer and over portions of the first bottom spacer;
forming a first interlayer dielectric layer over the first bottom spacer surrounding a portion of the first gate dielectric layer and the first gate conductor layer; and
recessing the first gate dielectric layer and the first gate conductor layer to a top surface of the first interlayer dielectric layer to provide the first gate stack.

20. The method of claim 19, further comprising:
forming a first top spacer over the first gate stack and the first interlayer dielectric layer;
forming first top source/drain regions surrounding a remainder of the first portion of the first semiconductor layer over the first top spacer;
forming a second interlayer dielectric layer surrounding the first top source/drain regions, the isolation layer and a first portion of the second semiconductor layer of the one or more vertical fins;
removing the first liner;
forming an oxide layer over the second interlayer dielectric layer;
forming a third liner on exposed sidewalls of the second semiconductor layer and the hard mask layer of the one or more vertical fins;
removing the oxide layer;
forming second bottom source/drain regions surrounding exposed sidewalls of the second semiconductor layer below the third liner;
forming a second bottom spacer surrounding the second bottom source/drain regions; and
performing a rapid thermal anneal to provide dopant drive-in for the first bottom source/drain regions, the first top source/drain regions and the second bottom source/drain regions.

21. The method of claim 20, wherein forming the second gate stack comprises:
forming the second gate dielectric layer over the one or more vertical fins and the second bottom spacer;
forming a capping layer over the second gate dielectric layer;
forming an additional amorphous silicon layer over the capping layer;
performing an additional reliability anneal;
removing the additional amorphous silicon layer and the capping layer;
forming the second gate conductor layer over the second gate dielectric layer;
performing an additional gate cut etch to remove portions of the second gate dielectric layer and the second gate conductor layer formed over the hard mask layer and over portions of the second bottom spacer;
forming a third interlayer dielectric layer over the second bottom spacer surrounding a portion of the second gate dielectric layer and the second gate conductor layer; and
recessing the second gate dielectric layer and the second gate conductor layer to a top surface of the third interlayer dielectric layer to provide the second gate stack.

22. The method of claim 21, further comprising:
forming a second top spacer over the second gate dielectric layer, the second gate conductor layer, and third interlayer dielectric layer;
removing the hard mask layer;
recessing a top surface of the second semiconductor layer to match a top surface of the second top spacer;
performing ion implantation and a laser spike anneal to form a top junction in the top surface of the second semiconductor layer of the one or more vertical fins;
forming second top source/drain regions over the top surface of the second semiconductor layer of the one or more vertical fins; and
performing a laser anneal.

* * * * *